US008917885B2

(12) United States Patent
Sakurada et al.

(10) Patent No.: US 8,917,885 B2

(45) Date of Patent: Dec. 23, 2014

(54) LOOP GAIN ESTIMATING APPARATUS AND HOWLING PREVENTING APPARATUS

(75) Inventors: Shinya Sakurada, Hamamatsu (JP); Takuro Sone, Hamamatsu (JP); Takaya Kakizaki, Hamamatsu (JP); Sachiya Sasaki, Hamamatsu (JP); Kosuke Saito, Hamamatsu (JP)

(73) Assignee: Yamaha Corporation (JP)

( * ) Notice: Subject to any disclaimer, the term of this patent is extended or adjusted under 35 U.S.C. 154(b) by 809 days.

(21) Appl. No.: 13/120,885

(22) PCT Filed: Sep. 24, 2009

(86) PCT No.: PCT/JP2009/066558

§ 371 (c)(1), (2), (4) Date: Mar. 24, 2011

(87) PCT Pub. No.: WO2010/035760

PCT Pub. Date: Apr. 1, 2010

(65) Prior Publication Data

US 2011/0182439 A1 Jul. 28, 2011

(30) Foreign Application Priority Data

Sep. 24, 2008 (JP) ................................. 2008-244700
Nov. 25, 2008 (JP) ................................. 2008-299588
Dec. 26, 2008 (JP) ................................. 2008-333608
Apr. 9, 2009 (JP) ................................. 2009-094696
Apr. 9, 2009 (JP) ................................. 2009-094697
Sep. 9, 2009 (JP) ................................. 2009-208285

(51) Int. Cl.
*H04B 15/00* (2006.01)
*H04R 1/10* (2006.01)
*H04R 27/00* (2006.01)
*H04R 3/00* (2006.01)
*H03G 9/00* (2006.01)
*H03G 5/00* (2006.01)
*H03G 3/00* (2006.01)
*H04R 3/02* (2006.01)

(52) U.S. Cl.
CPC ........................................ *H04R 3/02* (2013.01)
USPC ............. 381/93; 381/94.3; 381/73.1; 381/83; 381/95; 381/102; 381/103; 381/108

(58) Field of Classification Search
CPC ............ H04R 3/02; H04R 3/04; H04R 25/45; H04R 25/453; H04R 2430/01; H04R 2499/01; H04R 27/00; H04R 29/007; H04R 2227/001; H04R 2227/009; H04R 2430/03; H04R 2460/01; H04S 7/302; H04S 7/307; H04S 2400/09; H04S 2400/13; H03G 3/20; H03G 3/30; H03G 3/3005; H03G 3/301; H03G 3/3026; H03G 5/165; H03G 5/18; H03G 5/22; H03G 7/06; H03G 9/025; H03G 9/18; H03G 11/04; H03G 11/08; G10H 2250/125; G10H 2250/135; G10H 2250/211; G10H 2250/295; G10L 21/0208; G10L 21/0216; G10L 21/0224; G10L 21/0232; G10L 21/0264
USPC ............... 381/94.1–94.9, 71.1–71.14, 83, 93, 381/73.1, 95, 102, 103, 108
See application file for complete search history.

(56) References Cited

U.S. PATENT DOCUMENTS

| | | | |
|---|---|---|---|
| 6,072,879 A | 6/2000 | Ouchi et al. | |
| 6,301,364 B1 * | 10/2001 | Lowmiller et al. | 381/66 |
| 6,584,138 B1 * | 6/2003 | Neubauer et al. | 375/130 |
| 6,771,769 B2 * | 8/2004 | Erving et al. | 379/388.07 |
| 6,805,633 B2 * | 10/2004 | Hein et al. | 463/35 |
| 8,036,398 B2 * | 10/2011 | Ozawa | 381/94.1 |
| 8,588,404 B2 * | 11/2013 | Czyzewski et al. | 379/406.08 |
| 2002/0087305 A1 * | 7/2002 | Erving et al. | 704/226 |
| 2004/0137929 A1 | 7/2004 | Jones et al. | |
| 2006/0198532 A1 | 9/2006 | Tashiro | |
| 2008/0021703 A1 | 1/2008 | Kawamura et al. | |

FOREIGN PATENT DOCUMENTS

| | | | |
|---|---|---|---|
| JP | 06-327088 | A | 11/1994 |
| JP | 01-15788 | A | 1/1995 |
| JP | 10-69280 | A | 3/1998 |
| JP | 2001-148644 | A | 5/2001 |
| JP | 2004-128825 | A | 4/2004 |
| JP | 2005-160120 | A | 6/2005 |
| JP | 2005-210206 | A | 8/2005 |
| JP | 2006-261967 | A | 9/2006 |
| WO | 2005/125273 | A1 | 12/2005 |

OTHER PUBLICATIONS

Notification of Reasons for Refusal for corresponding JP 2009-208285, mail date Jun. 18, 2013. English translation provided.

Notification of Reasons for Refusal for corresponding JP 2008-299588, mail date Jun. 18, 2013. English translation provided.

Extended European Search Report for corresponding EP 09816175.5, mail date Jan. 27, 2014.

International Search Report issued in corresponding Japanese Patent application PCT/JP2009/066558 dated Oct. 20, 2009. English Abstract Provided.

Itami, Makoto et al. "A Study on Acoustic Howling Cancellers" Faculty of Engineering, University of Tokyo. p. 23-29, EA89-4.

* cited by examiner

*Primary Examiner* — Davetta W Goins
*Assistant Examiner* — Daniel Sellers
(74) *Attorney, Agent, or Firm* — Rossi, Kimms & McDowell LLP

(57) ABSTRACT

A pseudo noise superimposing unit superimposes a pseudo noise (M-sequence) to an audio signal picked up by a microphone and outputs the superimposed signal to an amplifying system. An calculating unit calculates a correlation value between the audio signal picked up by the microphone and the pseudo noise. The calculating unit estimates a gain of a closed loop based on the correlation value. A gain control unit suppresses a gain of the audio signal based on the estimated gain of the closed loop.

23 Claims, 18 Drawing Sheets

LOOP GAIN ESTIMATING APPARATUS AND HOWLING PREVENTING APPARATUS

This application is a U.S. National Phase Application of PCT International Application PCT/JP2009/066558 filed on Sep. 24, 2009 which is based on and claims priority from JP 2008-244700 filed on Sep. 24, 2008; JP 2008-299588 filed on Nov. 25, 2008; JP 2008-333608 filed Dec. 26, 2008; JP 2009-094696 filed Apr. 9, 2009; JP 2009-094697 filed Apr. 9, 2009 and JP 2009-208285 filed on Sep. 9, 2009, the contents of each of which are incorporated herein by reference in their entirety.

It is possible that when each of the loop gain calculated by the gain estimation unit 22 and the delay time period or a propagation distance of a sound calculated by the calculating unit 123 is not changed for a predetermined time period, the control unit 109 outputs the control signal to the correlation calculating unit 20 so as to reduce the frequency of calculating the correlation. In this case, a state in which the distance between the microphone 11 and the speaker 3 is constant and an audio level is constant, is continued, so that howling is not liable to occur. Therefore, the frequency of calculating a correlation by the correlation calculating unit 20 is decreased and a number of times of operations of the correlation calculating unit 20 is decreased, thereby suppressing power consumption.

TECHNICAL FIELD

The present invention relates to a loop gain estimating apparatus that estimates a gain of a closed loop, and a howling preventing apparatus that prevents howling.

BACKGROUND ART

Various techniques for preventing howling in a loud speaker system for a lecture, a concert or the like have been provided. In a general howling suppression method, when occurrence of howling is detected, a frequency range causing the howling is attenuated by a filter.

In an audio signal amplifier circuit described in patent document 1, when howling is detected, a low pass filter for removing howling is operated so as to decrease a gain of the audio signal amplifier circuit. The audio signal amplifier circuit checks whether or not the howling is detected by stopping the operation of the low pass filter at every predetermined time interval. The audio signal amplifier circuit decreases the gain in a stepwise manner until the howling is not detected. The audio signal amplifier circuit fixes the gain when the howling is not detected.

Patent document 2 discloses a method in which presence or absence of occurrence of howling is detected based on a frequency characteristic of an input signal and a filter characteristic for suppressing howling is calculated.

Non-patent document 1 proposes a howling canceller with the use of synchronized addition of an M-sequence noise. The howling canceller described in the non-patent document 1 outputs in advance a high level M-sequence noise so as to perform a training of an adaptive filter. The howling canceller outputs the M-sequence noise having a low level during its operation so as to continuously update the adaptive filter. In addition, the howling canceller disclosed in the non-patent document 1 determines that a disturbance level is high and stops the updating of the adaptive filter in a case where an input level of a microphone becomes high, because when the disturbance level becomes high due to continuous speaking of a person or generation of a sound of a musical instrument, the updating of the adaptive filter is inhibited.

Patent Document 1: JP-A-7-15788
Patent Document 2: JP-A-6-327088
Non-patent Document 1: "Inspection relating to removal of howling in an audio system" by Makoto Itami, Mitsutoshi Hatori, Institute of Electronics, Information, and Communication Engineers, Technical Reports EA89-4, in 1989

SUMMARY OF INVENTION

Problems that the Invention is to Solve

However, in the attenuation method by the general filter as shown in patent documents 1 and 2, since the method is adapted to suppress a frequency range including generated howling, the howling cannot be suppressed unless howling is once generated.

A position of a microphone may be usually moved in a lecture or a concert so that an environment of a closed loop is changed with an elapse of the time by the position or the like of the microphone. When the environment of the closed loop is changed and a loop gain thereof is changed, updating of a filter coefficient of the adaptive filter described in the non-patent document 1 can not follow the change so that the howling cannot be suppressed. In addition, when the updating of the adaptive filter is stopped in a case where the input level of the microphone is high as shown in the non-patent document 1, it is not possible to suppress the howling.

Each of the documents merely discloses the method of suppressing the frequency band that causes occurrence of howling, but not estimating the loop gain nor preventing occurrence of howling beforehand.

Consequently, a purpose of the invention is to provide a loop gain estimating apparatus capable of estimating a loop gain of a closed loop in order to prevent occurrence of howling beforehand even when an environment of the closed loop is changed.

Another purpose of the invention is to provide a howling preventing apparatus that prevent occurrence of howling beforehand in response to an environment in an audio space.

Means for Solving the Problems

A howling preventing apparatus according to a first aspect of the invention includes an input unit that inputs an audio signal, a noise generation unit that generates and outputs a pseudo noise, a superimposing unit that superimposes a component of a frequency of the pseudo noise output from the noise generation unit to the audio signal input by the input unit and outputs the superimposed signal to an amplifying system, the frequency being higher than a predetermined frequency, a correlation calculating unit that calculates a correlation value between the audio signal input by the input unit and the pseudo noise generated by the noise generation unit, a loop gain estimation unit that estimates a gain of a closed loop based on the correlation value calculated by the correlation calculating unit, and a gain control unit that controls to suppress the gain of the audio signal based on the gain of the closed loop estimated by the loop gain estimation unit.

A loop gain estimating apparatus according to a second aspect of the invention includes an input unit that inputs an audio signal, a noise generation unit that generates and outputs a pseudo noise, a superimposing unit that superimposes a component of a frequency of the pseudo noise output from the noise generation unit to the audio signal input by the input unit and outputs the superimposed signal to an amplifying system, the frequency being higher than a predetermined frequency, a correlation calculating unit that calculates a correlation value between the audio signal input by the input unit and the pseudo noise generated by the noise generation unit, and a loop gain estimation unit the estimates a gain of a closed loop based on the correlation value calculated by the correlation calculating unit.

Advantage of the Invention

In accordance with the invention, it is possible to predict occurrence of howling based on an estimated loop gain before occurrence of the howling. Therefore, even in a case where an environment of a closed loop is changed, for example, in a case where a position of a microphone is moved, the loop gain is estimated before occurrence of howling so that various measures can be taken, thereby preventing the howling.

MODE FOR CARRYING OUT THE INVENTION

First Embodiment

Figure 1:
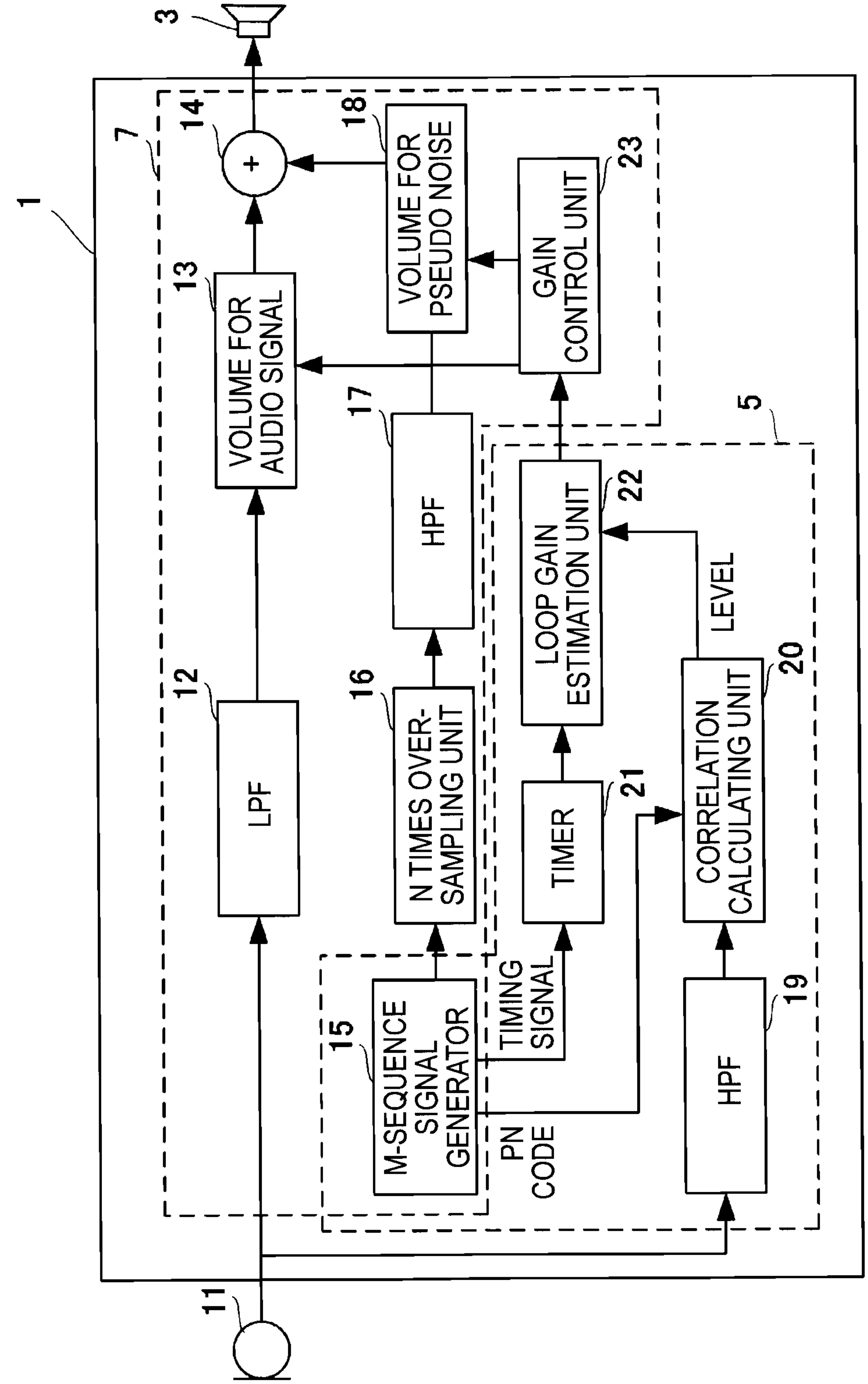
FIG. 1 is a block diagram showing a structure of a howling preventing apparatus according to a first embodiment.

FIG. 1 is a block diagram showing a structure of a howling preventing apparatus 1 according to a first embodiment. Meanwhile, all of the audio signals are defined as digital signals unless a specific description is added, and structures for A/D conversion and D/A conversion are omitted.

The howling preventing apparatus 1 has a calculating unit 5 and a pseudo noise superimposing unit 7, to which an audio signal picked up by a microphone 11 (an audio pickup unit) is input. The pseudo noise superimposing unit 7 superimposes the pseudo noise to the audio signal picked up by the microphone 11.

The audio signal superimposed with the pseudo noise by the pseudo noise superimposing unit 7 is amplified by an amplifying system (an amplifier) at a following stage (not shown) so as to be output from a speaker 3 as a sound. The sound output from the speaker 3 is fed back to the microphone 11 so that a closed loop is formed.

The howling preventing apparatus 1 estimates a gain of the closed loop at the calculating unit 5. The howling preventing apparatus 1 can prevent howling beforehand by suppressing the gain of the audio signal or generating a warning in a case where the estimated loop gain approaches a predetermined threshold value.

As shown in FIG. 1, the howling preventing apparatus 1 includes an LPF 12, a volume 13 for audio signal, a superimposing unit 14, an M-sequence signal generator 15, an N times over-sampling unit 16, an HPF 17, a volume 18 for pseudo noise, an HPF 19, a correlation calculating unit 20, a timer 21, a loop gain estimation unit 22, and a gain control unit 23.

The calculating unit 5 is configured by the M-sequence signal generator 15, the HPF 19, the correlation calculating unit 20, the timer 21, and the loop gain estimation unit 22. The pseudo noise superimposing unit 7 is configured by the volume 13 for audio signal, the superimposing unit 14, the M-sequence signal generator 15, the N times over-sampling unit 16, the HPF 17, the volume 18 for pseudo noise, and the gain control unit 23.

The audio signal picked up by the microphone 11 is input to the LPF 12 of the pseudo noise superimposing unit 7 and the HPF 19 of the calculating unit 5. A structure and a function of the pseudo noise superimposing unit 7 are described below with reference to FIG. 2. Waveforms of signals output from structural units are indicated at the lower columns of the respective structural units.

The audio signal picked up by the microphone 11 is input to the LPF 12 of the pseudo noise superimposing unit 7. While a waveform indicative of a frequency component of a signal indicated at the lower column of the microphone 11 is an example, in a practical sense, signals having various waveforms are input to the LPF 12.

Figure 2:
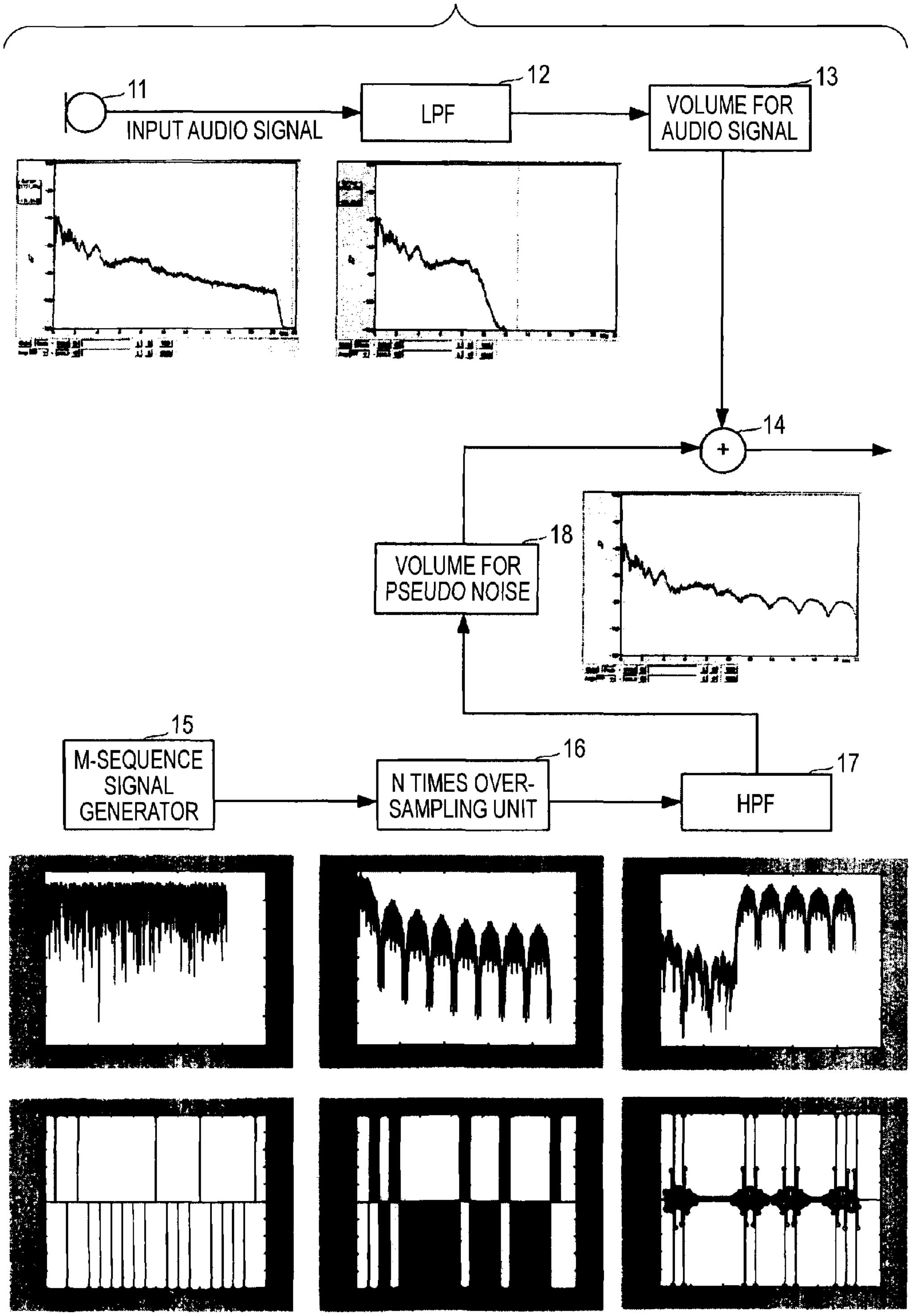
FIG. 2 is a block diagram showing a structure and process contents of a pseudo noise superimposing unit.

The LPF 12 cuts off a signal component in a frequency range higher than a cut-off frequency (e.g., an arbitrary frequency value in a range of 10 kHz to 20 kHz) from the picked-up audio signal and outputs it to the volume 13 for audio signal (see a waveform formed along a frequency axis indicated at the lower column of the LPF 12 in FIG. 2).

The volume 13 for audio signal outputs a signal picked up by the microphone 11 to the superimposing unit 14 at a gain set by the gain control unit 23.

The M-sequence signal generator 15 corresponds to a noise generation unit of the invention. The M-sequence signal generator 15 periodically generates a signal having a high self-correlation property as a pseudo noise like a PN code (M-sequence) and outputs it to the N times over-sampling unit 16 (see a waveform formed along a frequency axis indicated at the lower column of the M-sequence signal generator 15, however, the lowermost column shows a waveform formed along a time axis). Meanwhile, it is not limited to the M-sequence and another random number such as a Gold-sequence can be used.

An output cycle of the pseudo noises is set to be longer than a time period until when a level of a component of a reflection wave (an indirect wave) becomes equal to or lower than a predetermined level (a convergence time period of an impulse response in an audio transmission system) so that the loop gain estimation unit 22 (described later) can perform a process of estimating a loop gain.

The N times over-sampling unit 16 performs an over-sampling process of a pseudo noise signal (a bit string of a PN code) output from the M-sequence signal generator 15 by using a sampling clock having a frequency which is N times of a bit frequency thereof and outputs it to the HPF 17 (see a waveform formed along a frequency axis indicated at the lower column of the N times over-sampling unit 16 in FIG. 2, however, the lowermost column shows a waveform formed along a time axis). While the over-sampling process by the N times over-sampling unit 16 is not necessary, a time redundancy of a pseudo noise is increased by performing the over-sampling process so that the precision in calculating of a correlation can be improved. In a practical sense, it is possible to set use or non-use of the over-sampling process in accordance with a necessary precision and a code length of a pseudo noise.

The HPF 17 cuts off a low frequency range component of a signal input by the N times over-sampling unit 16 (see a waveform formed along a frequency axis indicated at the lower column of the HPF 17 in FIG. 2, however, the lowermost column shows a waveform formed along a time axis). A cut-off frequency of the HPF 17 is set to a value equal to or higher than the value of the cut-off frequency set by the LPF 12.

While the LPF 12 and LPF 17 are not necessary elements for the invention, sense of hearing can be improved by the elements. That is, since an audio in a low frequency range (an audible range of a human being) of a pseudo noise is cut off by the HPF 17, it becomes hard to hear the pseudo noise even when the pseudo noise is output from the speaker 3, thereby eliminating sense of discomfort in hearing. A pseudo noise in a high frequency range which is once picked up by the microphone is not output to the amplifying system again by the LPF 12, a loop phenomenon of a pseudo noise can be suppressed. In a case where the LPF 12 and HPF 17 are not provided, a pseudo noise component is subtracted from an audio signal picked up by the microphone 11, and then is output to the amplifying system so that a loop phenomenon of a pseudo noise can be suppressed.

The over-sampling process by the N times over-sampling unit 16 is not necessary for the invention. However, a time redundancy of a pseudo noise is increased by performing the over-sampling process so that the precision in calculating of a correlation can be improved. In a practical sense, it is possible to set use or non-use of the over-sampling process in accordance with a necessary precision and a code length of a pseudo noise.

A signal output from the HPF 17 is input to the volume 18 for pseudo noise. The volume 18 for pseudo noise outputs the output signal of the HPF 17 to the superimposing unit 14 at a gain set by the gain control unit 23. It is possible to make a level of a pseudo noise to be a very low level which may not cause sense of discomfort in hearing. However, a level having a degree by which a peak value of a correlation of a pseudo noise can be detected, is attained.

The superimposing unit 14 superimposes a signal (a pseudo noise) output from the HPF 17 to an audio signal output from the volume 13 for audio signal, and outputs the superimposed signal to the amplifying system.

Figure 3:
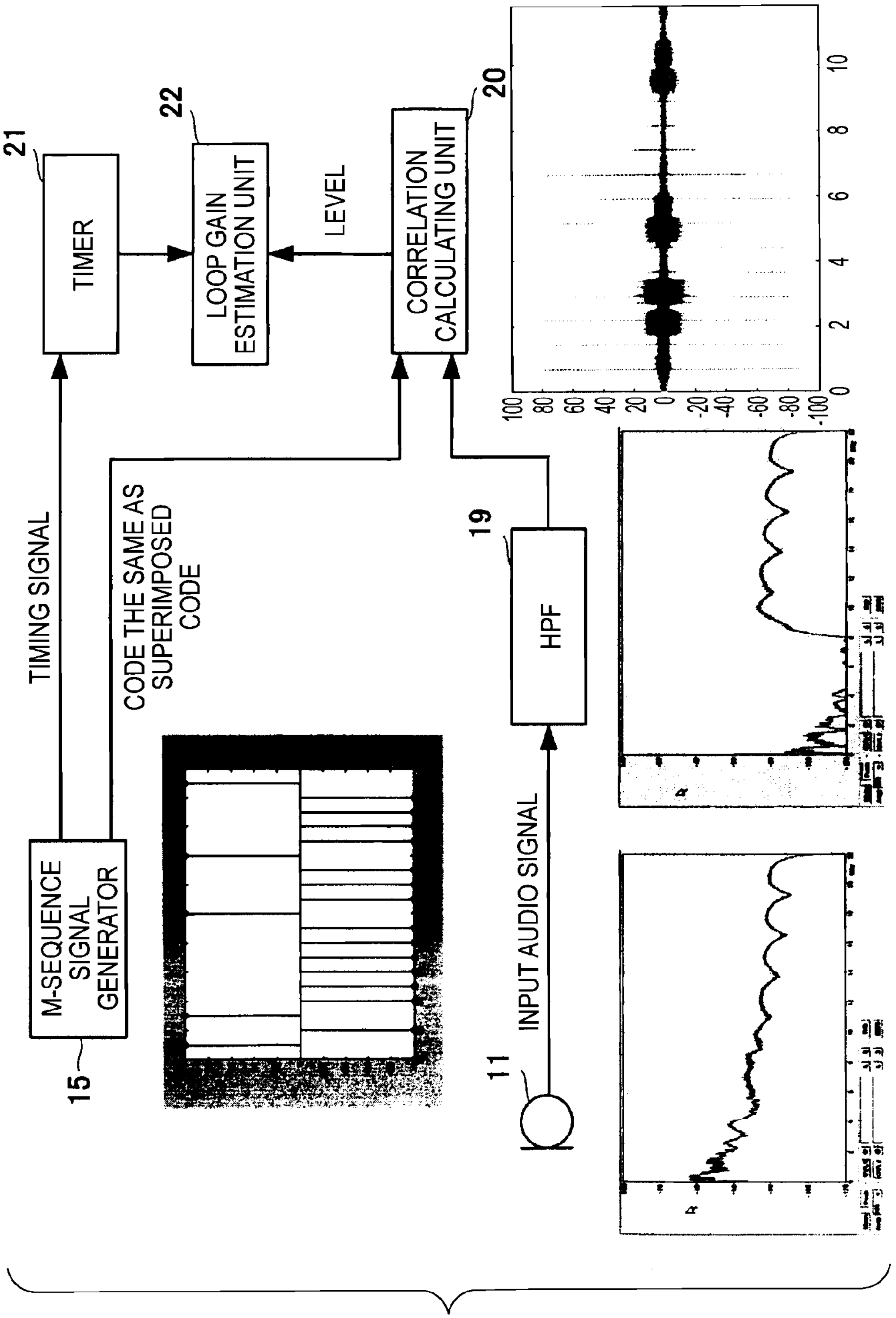
FIG. 3 is a block diagram showing a structure and process contents of a calculating unit.

Next, a structure and a function of the calculating unit 5 are described below with reference to FIG. 3. Waveforms of signals output from structural units are indicated at the lower columns of the respective structural units. The M-sequence signal generator 15 outputs a pseudo noise to the correlation calculating unit 20, the pseudo noise being the same as that output to the N times over-sampling unit 16 (see a waveform formed along a time axis indicated at the lower column of the M-sequence signal generator 15 in FIG. 3). After the M-sequence signal generator 15 outputs the pseudo noise, the M-sequence signal generator 15 transmits a signal (a timing signal) indicative of an output timing to the timer 21. When the timer 21 receives the timing signal, the timer 21 starts counting of a time period, and transmits a timer signal indicative of a counted time period to the loop gain estimation unit 22. Meanwhile, the timer 21 is not necessary for the invention.

An audio including a pseudo noise is picked up by the microphone 11. The audio signal picked up by the microphone 11 is input to the HPF 19 of the calculating unit 5. The HPF 19 cuts off a low frequency range component of the audio signal picked up by the microphone 11 and outputs it to the correlation calculating unit 20 (see a waveform formed along a frequency axis indicated at the lower column of the HPF 19 in FIG. 3). The cut-off frequency of the HPF 19 is determined corresponding to the HPF 17.

The correlation calculating unit 20 calculates a correlation between a pseudo noise input by the M-sequence signal generator 15 and an output signal of the HPF 19 (an audio signal picked up by the microphone 11). Since an M-sequence code has an extremely high self-correlation property, when an output signal of the HPF 19 includes a pseudo noise in the same M-sequence, a level of a correlation value is raised as shown by a waveform (a lateral axis is a time axis) with a time change of a correlation value indicated at the lower column of the correlation detection unit 20. The correlation calculating unit 20 outputs a signal indicative of a timing (a signal reception timing) of calculating a high level correlation value and the correlation value at that time to the loop gain estimation unit 22.

When the signal indicative of the signal reception timing is input by the correlation calculating unit 20, the loop gain estimation unit 22 calculates a time difference from the timing of outputting the pseudo noise to the signal reception timing by referring to a timer signal from the timer 21. The time difference corresponds to a delay time period of the closed loop. In a case where the delay time period of the closed loop is not measured (there is not the timer 21), the outputting of the signal reception timing by the correlation calculating unit 20 is not necessary.

The loop gain estimation unit 22 performs a process of estimating a loop gain. Various modifications can be made to the estimation method of the loop gain. For example, the following is one of such modifications.

Figure 4:
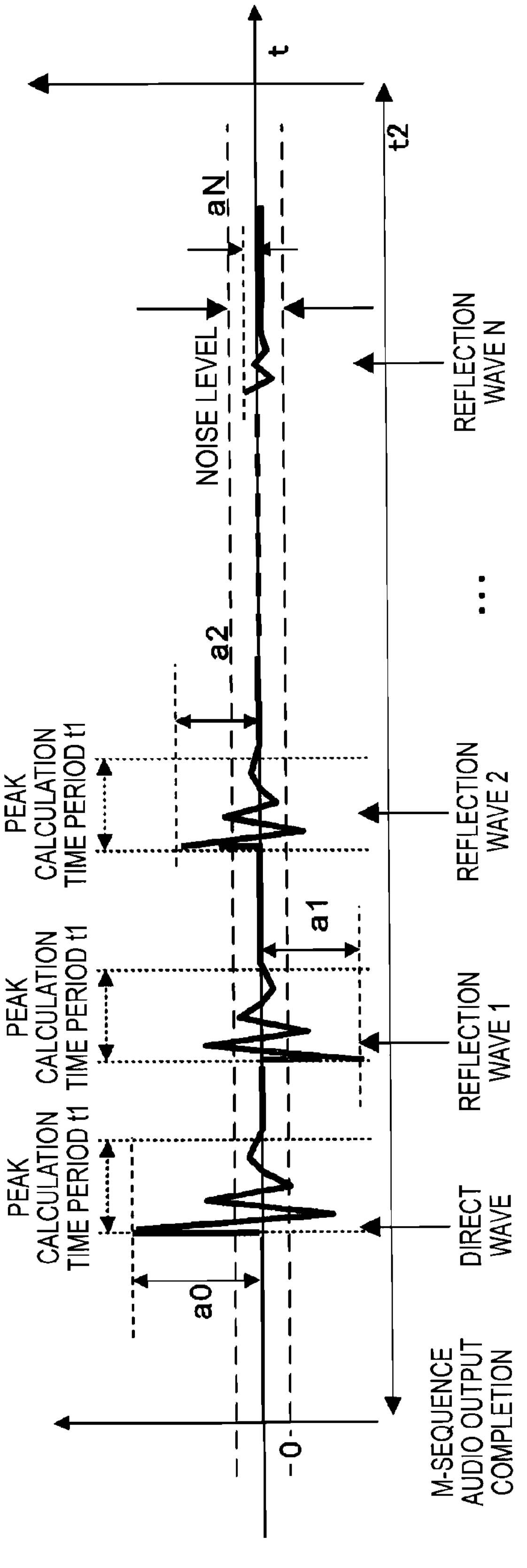
FIG. 4 is an illustrated graph showing a time axis characteristic of a correlation.

First, a first estimation method is described below with reference to FIG. 4. FIG. 4 is an illustrated graph typically showing a time axis characteristic of a correlation.

In a case where the loop gain estimation unit 22 calculates a correlation value equal to or higher than a predetermined level, at first, from a timing of outputting a pseudo noise, the loop gain estimation unit 22 assumes that the correlation value in a time period calculated at first is a direct wave and calculates a peak component of the direct wave. That is, in a case where the loop gain estimation unit 22 calculates a correlation value equal to or higher than a predetermined level, after that, the loop gain estimation unit 22 causes a memory (not shown) to temporarily store the correlation value at a predetermined time period t1, and extracts a correlation value having the highest level in the predetermined time period t1 so as to make it to be a peak value a0. The predetermined level is set in accordance with a level of a normal noise. The predetermined time period t1 for extracting the peak value is set in accordance with a precision in calculating of a correlation value (a code length of a pseudo noise or the like), presence or absence of the HPF 19, a cut-off frequency, and the like.

In a case where the loop gain estimation unit 22 first calculates a correlation value equal to or higher than a predetermined level, and then calculates a correlation value equal to or higher than a predetermined level again after the predetermined time period t1 has elapsed, the loop gain estimation unit 22 assumes that the correlation value is a reflection wave, and calculates a peak component of the reflection wave. Similarly to the above, in a case where the loop gain estimation unit 22 calculates a correlation value equal to or higher than a predetermined level, after that, the loop gain estimation unit 22 causes a memory to temporarily store correlation values in a predetermined time period t1 and extracts the correlation value having the highest level to make it to be a peal value a1. Similarly to the above, peak values (a1, a2, . . . ) of the reflection wave are extracted for a predetermined time period t2. The predetermined time period t2 described above corresponds to an output cycle of the pseudo noises. Meanwhile, in a case where a reverberation time in a room is revealed in a certain degree, it is possible to set the time period t2 in advance or to allow a user to manually input the time period t2.

The loop gain estimation unit 22 calculates absolute values (|a1|, |a2|, . . . ) of the peak values of the extracted direct waves and the reflection waves so as to estimate a loop gain based on the sum of the absolute values. Thus, since the loop gain estimation unit 22 performs a process of estimating a loop gain based on a feedback component of the direct wave and a feedback component of the reflection wave causing occurrence of howling, it is possible to precisely estimate the loop gain. The first estimation method is adapted to perform the estimation of the loop gain based on the sum of the correlation values of the peak components of the direct wave and the reflection wave by assuming that there are many cases that the peak component causes the occurrence of howling.

Meanwhile, since, in the above method, the output cycle of the pseudo noises is set to be longer than a convergence time period of an impulse response in the audio transmission system, it is possible to output a dummy noise until a pseudo noise is next output after the pseudo noise is output so as to eliminate a silent time period. By continuously outputting a noise sound, it is possible to make the pseudo noise inconspicuous, thereby eliminating sense of discomfort in hearing.

Figure 5:
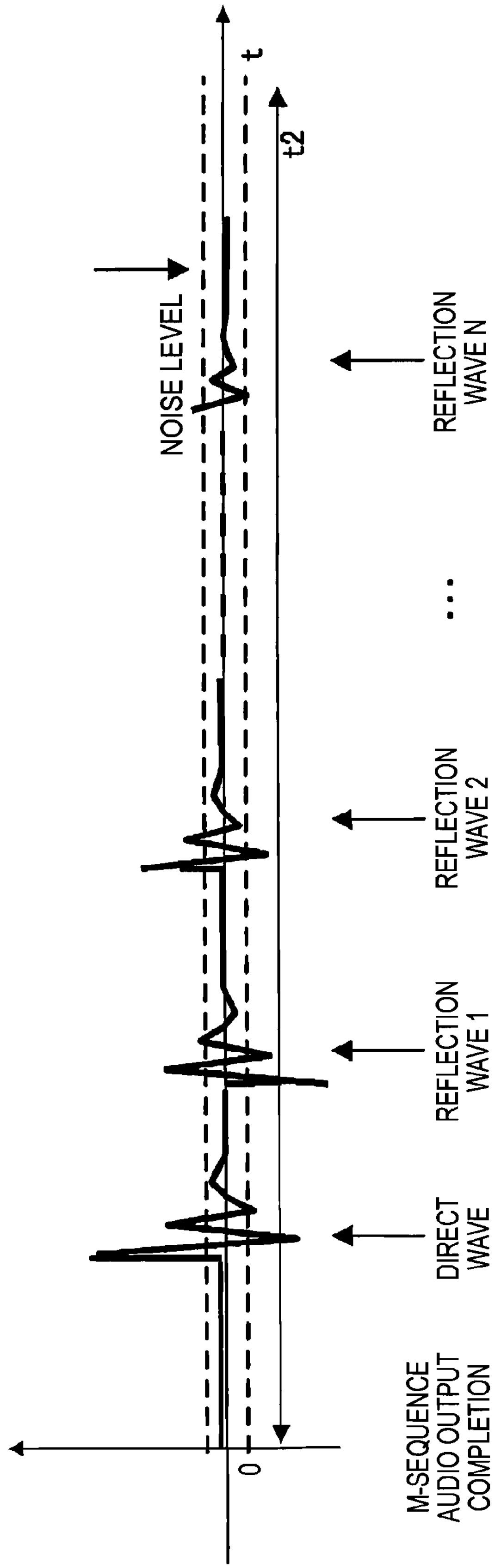
FIG. 5 is an illustrated graph showing a time axis characteristic of a correlation.

Next, a second estimation method is described below with reference to FIG. 5. FIG. 5 is an illustrated graph typically showing a time axis characteristic of a correlation.

The loop gain estimation unit 22 extracts all of the correlation values each being equal to or higher than a predetermined level until a predetermined time length t2 has elapsed from a timing of outputting a pseudo noise, and then calculates the sum of the absolute values thereof (calculates the integration value). The predetermined level in the above case is set in accordance with a level of a normal noise. Here, the predetermined time length t2 corresponds to an output cycle of the pseudo noises.

Thus, the second estimation method is adapted to highly precisely perform the estimation of the loop gain by summing up all of the components of direct waves and indirect waves.

Figure 6:
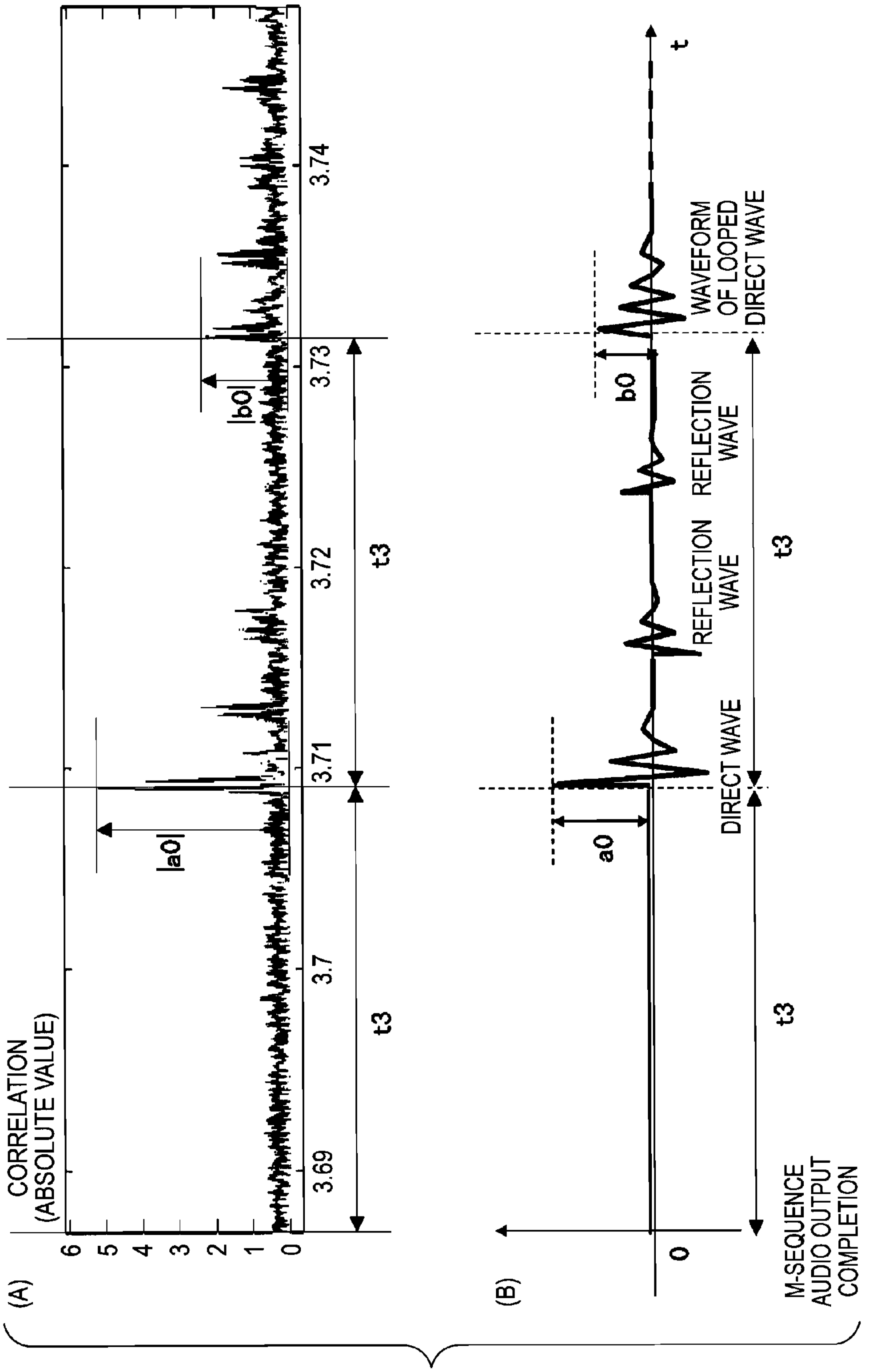
FIG. 6 is an illustrated graph showing a time axis characteristic of a correlation.

Next, a third estimation method is described below with reference to FIG. 6. FIG. 6(A) is an illustrated graph showing a time axis characteristic of a correlation (an absolute value), and FIG. 6(B) is an illustrated graph typically showing the time axis characteristic. This estimation method is applicable to a case where the LPF 12 is not provided.

The loop gain estimation unit 22, as shown in the first estimation method, first, extracts the peak value of the direct wave and acquires the absolute value |a0| thereof. The loop gain estimation unit 22 acquires an absolute value |b0| of a correlation at a time when a time period t3 has further elapsed from the peak. The time period t3 can be obtained from a time period (the delay time period of the closed loop) from a timing of outputting a pseudo noise to a timing of calculating a peak of the correlation at first. (In this method, the timer 21 is necessary.) Meanwhile, the absolute value |b0| is not limited to a value at a timing when the time period t3 has elapsed from the first peak, it is possible to take a value at a time when an absolute value of the correlation is the largest in a time period after the time period t3 has elapsed and around that time (e.g., before or after that time by dozens of microseconds).

A delay time period of a space sound output system from the speaker to the microphone is greater than a delay time period of a signal processing system from the microphone to the speaker, and the time period t3 corresponds to a delay time period of the closed loop. Consequently, it is possible to determine that a waveform in a time period from the first peak until the time period t3 has further elapsed, is a reflection wave from a wall or the like. It is possible to determine that a waveform around a timing when the time period t3 has elapsed is a direct wave that a pseudo noise output from the speaker 3 turns one round to return to the howling preventing apparatus 1 again. The loop gain estimation unit 22 estimates that a ratio (|b0|/|a0|) of the absolute value |a0| to the absolute value |b0| is the loop gain.

The third estimation method is adapted to estimate the loop gain in such a manner that it is determined that the waveform at a time around a timing when the time period t3 has further elapsed from when the peak component of the direct wave is first extracted, is a direct wave that a pseudo noise output from the speaker 3 is looped again.

As an estimation method other than the above, it is possible to estimate that a peak component of the direct wave which is simply extracted at first, is the loop gain. Since the component of the direct wave mainly causes occurrence of howling, it is possible to estimate the loop gain in a simple manner. Alternatively, it is possible to estimate that a maximum peak component extracted from a plurality of peak components generated during an output cycle of the pseudo noises, is the loop gain.

In each of the above estimation methods, since the output cycle of the pseudo noises is set to be longer than the convergence time period of the impulse response in the audio transmission system, it is possible to output a dummy noise until a pseudo noise is next output after the pseudo noise is output so as to eliminate a silent time period. By continuously outputting a noise sound, it is possible to make a pseudo noise inconspicuous, thereby eliminating sense of discomfort in hearing.

The loop gain estimated by the loop gain estimation unit 22 is output to the gain control unit 23. In a case where the estimated loop gain approaches a predetermined threshold value th, the gain control unit 23 determines that there is a high possibility that howling occurs and instructs to suppress a gain of the volume 13 for audio signal. The gain control unit 23 can generate a warning (lighting of an LED, displaying a warning on a display, or the like) in the case where the loop gain approaches a predetermined threshold value. Meanwhile, it is possible to perform one of a process of suppressing a gain and a process of generating a warning, or to perform the process of generating a warning and additionally the process of suppressing a gain of an audio signal. It is possible to take a modification that the generating a warning is first performed and, after that, the process of suppressing a gain is performed.

Here, the predetermined threshold value th differs depending on the estimation method of a loop gain. The predetermined threshold value th can be any value, but a margin having a certain degree is set to the threshold value th. For example, when a user carries out an operation of increasing or decreasing a gain before actual use and howling occurs, the user may carry out an operation of inputting occurrence of howling by an operation unit (not shown) of the howling preventing device 1. Alternatively, a frequency characteristic of an audio signal is analyzed by either one of processing units of the howling preventing apparatus 1 and detects that howling occurs when a single frequency component becomes a high level for a predetermined time period or more. The gain control unit 23 makes an estimation value of the loop gain input at that time to be a maximum value thmax of the threshold value and obtains the value of $th=\alpha\times thmax$ by using a coefficient $\alpha$ ($0<\alpha\leq 1$).

Thus, the calculating unit 5 estimates a gain of the closed loop, and performs a process of suppressing a gain of an audio signal or a process of generating a warning in a case where the estimated loop gain approaches a predetermined threshold, thereby preventing occurrence of howling beforehand.

Since the howling preventing apparatus 1 can predict occurrence of howling based on the estimated loop gain, the howling preventing apparatus 1 can adequately prevent howling even in a case where a position of a microphone is often moved as in a presentation or a live musical performance.

The gain control unit 23 instructs to suppress a gain of the volume 13 for audio signal and also a gain of the volume 18 for pseudo noise. However, the gain control unit 23 maintains a gain equal to or greater than a predetermined value so that a first peak of a correlation of a pseudo noise can be detected. About the predetermined value, it is possible to use a value obtained by measurement in a laboratory or the like beforehand. Alternately, it is possible to use a value obtained in such a manner that testing is performed before actual use in a placement environment and a limit gain enabling calculation of a peak of a correlation, the value being set by considering a margin having a certain degree.

It is possible to prepare a plurality of patterns of pseudo noises generated by the M-sequence signal generator 15, and then to change the patterns. For example, even in a case where a plurality of microphones are simultaneously used, by changing the pattern of a pseudo noise by each microphone (each input channel), it is possible to precisely calculate a correlation without causing interference of pseudo noises with each other. Since a loop gain of the closed loop can be estimated by each of the microphones, howling can be adequately prevented even in a case where the plurality of microphones are simultaneously used.

Particularly, in a case where a Gold-sequence is used as a pseudo noise, by changing a tap position of a code generation circuit (a shift register), various kinds of code sequences can be generated. Therefore, it is possible to apply the first embodiment to a large PA system.

In accordance with the above embodiment, it is possible to predict occurrence of howling based on an estimate loop gain before occurrence of the howling. Therefore, even in a case where an environment of the closed loop is changed, for example, in a case where a position of the microphone is moved, a loop gain can be estimated before occurrence of howling so that various measures can be taken, thereby preventing the howling.

Second Embodiment

Figure 7:
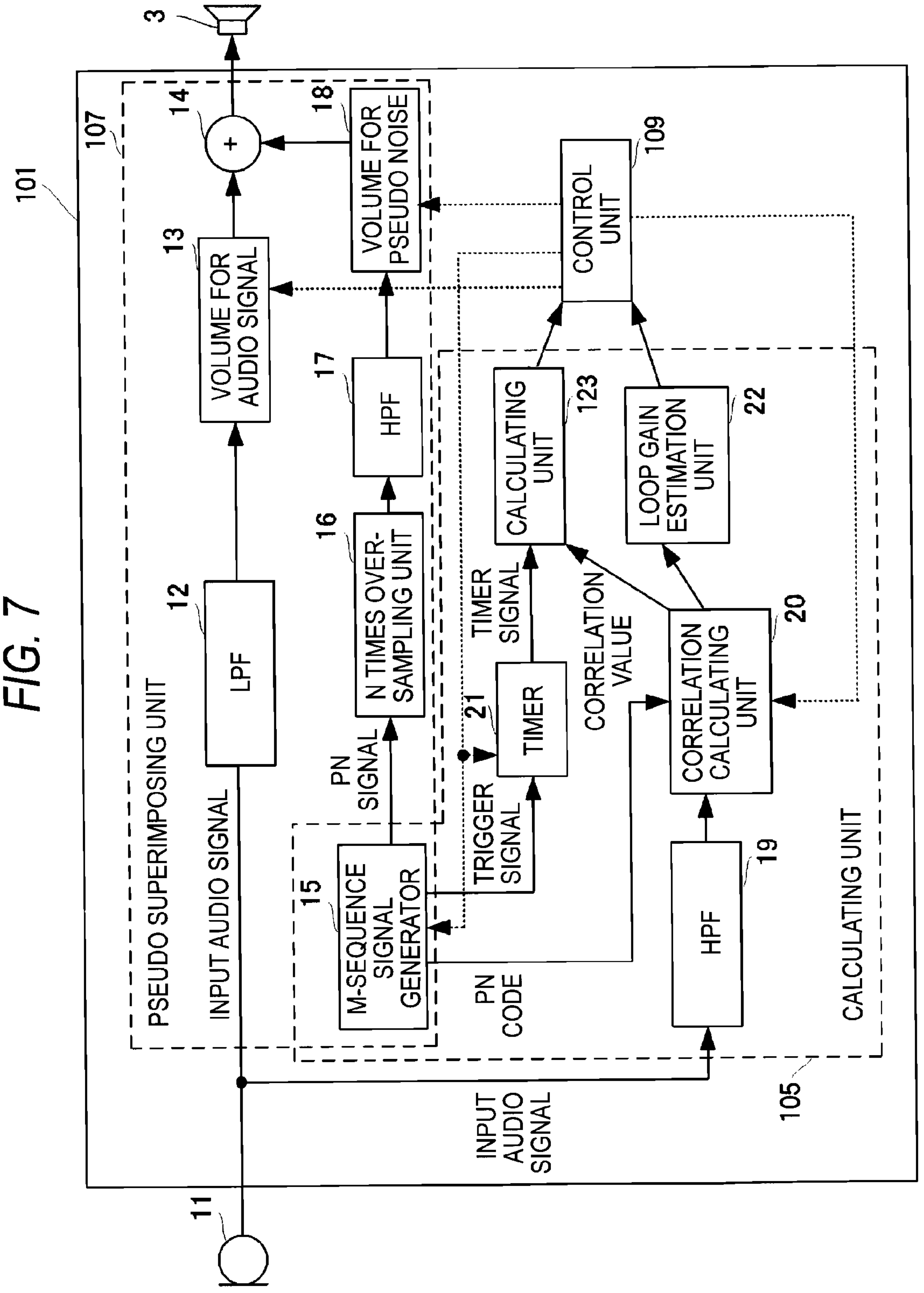
FIG. 7 is a block diagram showing a structure of a howling preventing apparatus according to a second embodiment.

FIG. 7 is a block diagram showing a structure of a howling preventing apparatus according to a second embodiment of the invention. In the descriptions of the embodiment, all of the audio signals are defined as digital signals unless a specific description is added, and a structure of performing A/D conversion or D/A conversion is omitted. Parts having structures the same as in the calculating unit 5 and the pseudo noise superimposing unit 7 in the howling preventing apparatus 1 shown in FIG. 1 are denoted by the same numerals, and their descriptions are omitted.

A howling preventing apparatus 101 includes a calculating unit 105, a pseudo noise superimposing unit 107, and a control unit 109. The howling preventing apparatus 101 is coupled to the microphone 11 which is connected to the LPF 12 and the HPF 19 in the howling preventing apparatus 101.

The howling preventing apparatus 101 includes a control unit 109 that prevents occurrence of howling while controlling a gain of an audio signal to be output from the pseudo noise superimposing unit 107 in accordance with a delay time period of a closed loop or a loop gain output from the calculating unit 105. The control unit 109 changes a frequency of calculating a correlation between an audio signal picked up by the microphone 11 and a pseudo noise generated by the calculating unit 105 in accordance with a delay time period measured by the calculating unit 105 or a value of a loop gain.

The pseudo noise superimposing unit 107 of the second embodiment has a structure similar to that of the pseudo noise superimposing unit 7 of the first embodiment so that the descriptions are omitted.

Next, a structure and a function of the calculating unit 105 are described below.

The control unit 109 outputs a trigger signal to the M-sequence signal generator 15 and the timer 21 in a predetermined cycle.

The M-sequence signal generator 15 outputs a pseudo noise same as that is output to the N times over-sampling unit 16 to the correlation calculating unit 20 when a trigger signal is input by the control unit 109.

The timer 21 starts measurement of a time when a trigger signal from the control unit 109 is input, and then outputs a timer signal indicative of a counted time period to a calculating unit 123.

The microphone 11 coupled to the howling preventing apparatus 101 picks up an audio including a pseudo noise, and outputs the audio signal to the HPF 19. The HPF 19 cuts off a low frequency range (e.g., lower than 20 kHz) from the audio signal picked up by the microphone 11, and outputs it to the correlation calculating unit 20.

The correlation calculating unit 20 calculates a correlation between a pseudo noise input by the M-sequence signal generator 15 and an output signal (an audio signal picked up by the microphone 11) of the HPF 19. Since a code of the M-sequence has an extremely high self-correlation property, when the output signal of the HPF 19 includes a pseudo noise in the same M-sequence, a level of a correlation value is raised. At a timing when the correlation calculating unit 20 calculates a correlation value with a high level (a reception timing), the correlation calculating unit 20 outputs the correlation value at that time to the loop gain estimation unit 22 and the calculating unit 123. While the detail is described later, the correlation calculating unit 20 changes a frequency of calculating a correlation in accordance with a control signal from the control unit 109.

When a correlation value is input by the correlation calculating unit 20, the calculating unit 123 refers to a timer signal (a time period counted value) from the timer 21 so as to calculate a time difference from the timing of outputting a pseudo noise to the reception timing. The time difference corresponds to a delay time period of the closed loop. The calculating unit 123 outputs information about the delay time period to the control unit 109. It is possible that the calculating unit 123 multiplies a sonic velocity to the delay time period so as to calculate a distance from the speaker 3 to the microphone device 11, and then outputs information about the distance to the control unit 109.

The gain estimation unit 22 corresponding to an estimation unit estimates a loop gain based on a correlation value, and outputs information about the estimated loop gain to the control unit 109. Various modifications can be made to the estimation method of a loop gain. For example, each of the estimation methods described in the first embodiment can be used.

Thus, the loop gain estimated by the gain estimation unit 22 is output to the control unit 109.

The control unit 109 controls the volume 13 for audio signal based on the information input by the gain estimation unit 22 and the calculating unit 123 so as to adjust a gain of an audio signal.

To be specific, the control unit 109 adjusts a gain in accordance with the value of the estimated loop gain. That is, the control unit 109 determines that a possibility of occurrence of howling is increased as the value of the estimated loop gain approaches more closely the predetermined threshold value th, and then the control unit 109 outputs a control signal for lowering the gain to the volume 13 for audio signal. In addition, the control unit 109 determines that a possibility of occurrence of howling is decreased as the value of the estimated loop gain departs more from the predetermined threshold value th, and then the control unit 109 outputs a control signal for raising the gain to the volume 13 for audio signal. With this configuration, howling can be prevented beforehand.

The control unit 109 can adjust a gain based on the delay time period of the closed loop calculated by the calculating unit 123 or the distance between the microphone 11 and the speaker 3 in addition to the value of the above described loop gain. That is, the control unit 109 determines that a possibility of occurrence of howling is increased as the delay time period of the closed loop or the distance between the microphone 11 and the speaker 3 calculated by the calculating unit 123 becomes shorter, and then the control unit 109 outputs the control signal for lowering the gain to the volume 13 for audio signal.

Meanwhile, the predetermined threshold value th can be set by an input operation of a user or can be a specified value.

The control unit 109 can be configured so as to display a warning on a display unit (not shown) when a value of a loop gain approaches the predetermined threshold value th and howling tends to occur. In this case, when a user having the microphone 11 moves away from the speaker 3 in accordance with displaying of the warning, howling can be prevented beforehand.

The control unit 109 can perform both of or one of adjusting of the gain and displaying of the warning.

Next, the control unit 109 controls to change a frequency of calculating a correlation by the correlation calculating unit 20 based on the information input by the loop gain estimation unit 22 and the calculating unit 123. To be specific, the control unit 109 causes the correlation calculating unit 20 to operate in such a manner that the frequency of calculating a correlation by the correlation calculating unit 20 is increased as the estimated value of the loop gain approaches more closely the predetermined threshold th, and the frequency thereof is decreased as the estimated value of the loop gain departs more from the predetermined threshold th so that the correlation calculating unit 20 intermittently calculates the correlation.

The control unit 109 can change the frequency of calculating a correlation by the correlation calculating unit 20 based on a delay time period of the closed loop or a distance between the microphone 11 and the speaker 3 instead of the value of the loop gain. That is, the control unit 109 controls the correlation calculating unit 20 in such a manner that the frequency of calculating a correlation by the correlation calculating unit 20 is increased as the delay time period of the closed loop 3 or the distance calculated by the calculating unit 123 becomes shorter, and the frequency thereof is decreased as the delay time period of the closed loop or the distance becomes longer so that the correlation calculating unit 20 intermittently calculates the correlation.

The control unit 109 can change the frequency of calculating a correlation by the correlation calculating unit 20 based on both of the value of the loop gain and the value of the delay time period of the closed loop or the distance between the microphone 11 and the speaker 3.

That is, in a case (1) where the value of the loop gain is in close proximity to the predetermined threshold value th and the delay time period of the closed loop or the distance between the microphone 11 and the speaker 3 is short, the control unit 109 controls in such a manner that the correlation calculating unit 20 constantly operates to calculate the correlation. In a case (2) where the value of the loop gain is away from the predetermined threshold value th and the delay time period of the closed loop or the distance between the microphone 11 and the speaker 3 is equal to or longer than a predetermined value, the control unit 109 causes the correlation calculating unit 20 to intermittently operate so as to extend a time period of stopping the operation of the correlation calculating unit 20 in accordance with the values. In a case (3) where the value of the loop gain is in close proximity to the predetermined threshold value th and the delay time period of the closed loop or the distance between the microphone 11 and the speaker 3 is long or in a case (4) where the value of the loop gain is away from the predetermined threshold value th and the delay time period of the closed loop or the distance between the microphone 11 and the speaker 3 is short, the control unit 109 causes the correlation calculating unit 20 to intermittently operate so as to reduce a time period of stopping the operation of the correlation calculating unit 20 in accordance with the values.

In the above cases (2) to (4), it is preferable to cause the correlation calculating unit 20 to intermittently operate in such a manner that, for example, the more the value of the loop gain is in close proximity to the threshold value or the shorter the delay time or the distance is, the more the time period of stopping the operation of the correlation calculating unit 20 is reduced.

In the case (1), it is preferable that the correlation calculating unit 20 constantly operates when the value of the loop gain and the delay time period of the closed loop or the distance between the microphone 11 and the speaker 3 becomes shorter than a predetermined threshold value.

It is preferable that the time period of allowing the correlation calculating unit 20 to intermittently operate is obtained by carrying out an experiment beforehand. In a case where categorizing is performed as in the above, it is preferable that a plurality of threshold values are set, and the frequency of calculating a correlation is set in accordance with a magnitude relation between the threshold values and the value of the loop gain, the delay time period of the closed loop or the distance between the microphone 11 and the speaker 3.

It is possible to change the code length of the M-sequence in response to the frequency of estimating the loop gain. For example, in a case where the frequency of estimating the loop gain is high, it is preferable that the length of the M-sequence is made short. In a case where the frequency of estimating the loop gain is low, it is preferable that the length of the M-sequence is made long. In the case where the frequency of estimating the loop gain is high, since the gain of the audio signal is high and the distance between the microphone 11 and the speaker 3 is short, the correlation of the pseudo noise can be surely obtained even when the length of the M-sequence is made short. While the calculating time period is changed in accordance with the distance, it is possible to follow an environment change by changing the code length in accordance with the distance.

It is possible to change a generation interval of a PN code to be used in accordance with the frequency of estimating the loop gain. It is preferable that, for example, in a case where the frequency of estimating the loop gain is high, the generation interval of the PN code is made short, but in a case where the frequency of estimating the loop gain is low, the generation interval of the PN code is made long. With this, since it is possible to generate the PN code as the need arises, the loop gain can be surely estimated.

It is possible to change a number of sequences of a PN code to be used in accordance with the frequency of estimating the loop gain. For example, in a case where the frequency of estimating the loop gain is high, a plurality (e.g., three) of different PN codes (codes of M-sequence) are sequentially output from the M-sequence signal generator 15 by slightly shifting the timings. On the other hand, in a case where the frequency of estimating the loop gain is low, one PN code is output from the M-sequence signal generator 15 at a predetermined timing. With this configuration, even in the case where the frequency of estimating the loop gain is high, it is possible to continuously estimate the loop gain in a short time period so that occurrence of howling can be precisely prevented. Even in the case where the frequency of estimating the loop gain is low, the loop gain can be surely estimated.

It is possible that when each of the loop gain calculated by the gain estimation unit 22 and the delay time period or a propagation distance of a sound calculated by the calculating unit 123 is not changed for a predetermined time period, the control unit 109 outputs the control signal to the correlation calculating unit 20 so as to reduce the frequency of calculating the correlation. In this case, a state in which the distance between the microphone unit 101 and the speaker 3 is constant and an audio level is constant, is continued, so that howling is not liable to occur. Therefore, the frequency of calculating a correlation by the correlation calculating unit 20 is decreased and a number of times of operations of the correlation calculating unit 20 is decreased, thereby suppressing power consumption.

Since the howling preventing apparatus of this embodiment changes the frequency of performing a correlation process in accordance with a condition that howling is likely to occur or not, the number of times of performing the process can be reduced when it is not necessary to frequently perform the correlation process so that the amount of power consumption can be suppressed while surely preventing the howling.

Third Embodiment

Figure 8:
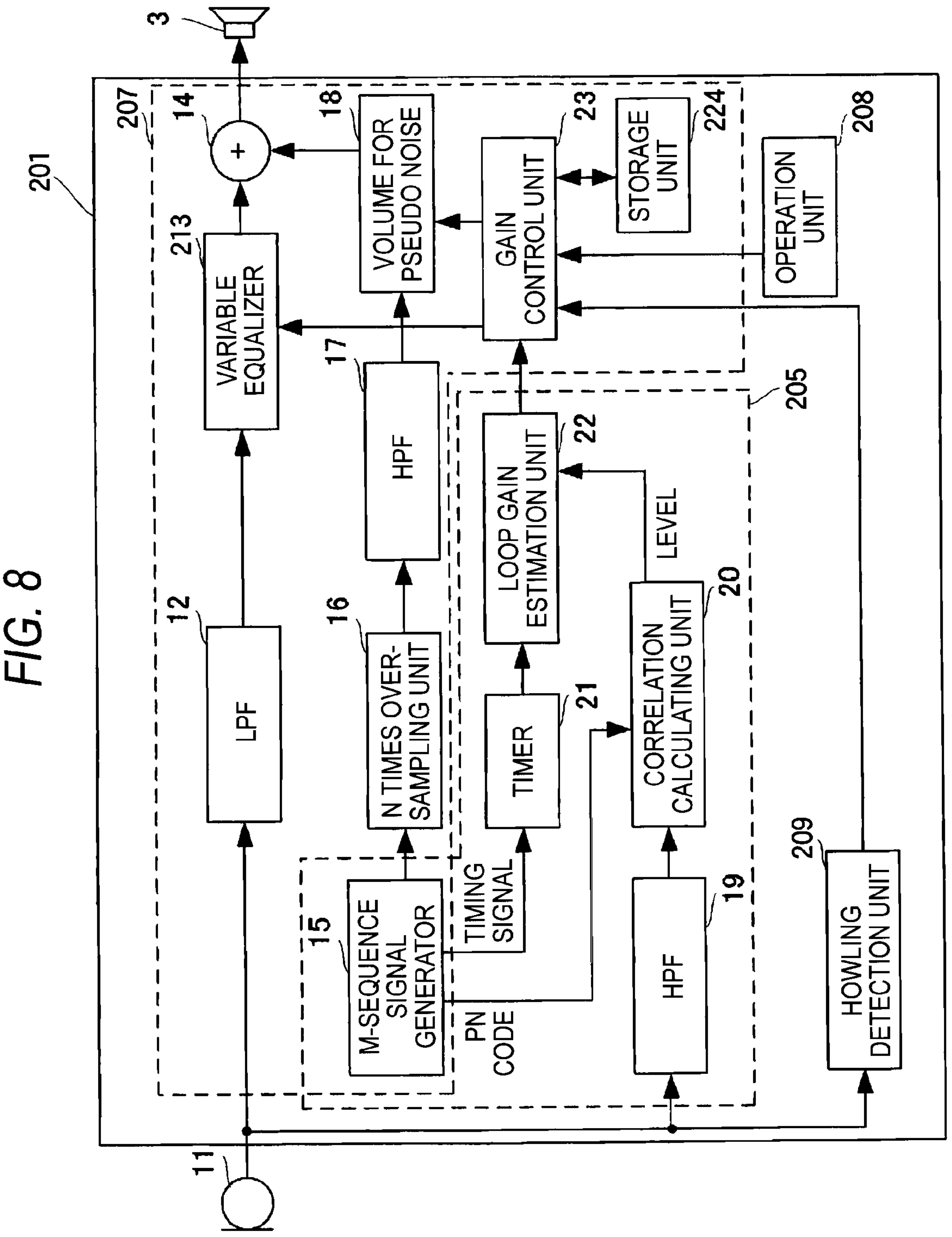
FIG. 8 is a block diagram showing a structure of a howling preventing apparatus according to a third embodiment.

FIG. 8 is a block diagram showing a structure of a howling preventing apparatus according to a third embodiment of the invention. In the descriptions of the embodiment, all of the audio signals are defined as digital signals unless a specific description is added, and a structure of performing A/D conversion or D/A conversion is omitted. Parts having structures the same as in the calculating unit 5 and the pseudo noise superimposing unit 7 in the howling preventing apparatus 1 shown in FIG. 1 are denoted by the same numerals, and their descriptions are omitted.

A howling preventing apparatus 201 includes an calculating unit 205 that inputs an audio signal picked up by the microphone 11 (an audio pickup unit), a pseudo noise superimposing unit 207, and an operation unit 208, and a howling detection unit 209. The pseudo noise superimposing unit 207 superimposes a pseudo noise to an audio signal picked up by the microphone 11.

As shown in FIG. 8, the howling preventing apparatus 201 includes the LPF 12, a variable equalizer 213, the superimposing unit 14, the M-sequence signal generator 15, the N times over-sampling unit 16, the HPF 17, the volume 18 for pseudo noise, the HPF 19, the correlation calculating unit 20, the timer 21, the loop gain estimation unit 22, the gain control unit 23, and a storage unit 224.

The calculating unit 205 has a structure, a function and an operation similar to those of the calculating unit 5 according to the first embodiment. The pseudo noise superimposing unit 207 is configured by the variable equalizer 213, the superimposing unit 14, the M-sequence signal generator 15, the N times over-sampling unit 16, the LPF 12, the HPF 17, the volume 18 for pseudo noise, the gain control unit 23 and the storage unit 224. Each of the superimposing unit 14, the M-sequence signal generator 15, the N times over-sampling unit 16, the HPF 17, the volume 18 for pseudo noise, and the gain control unit 23 has a structure, a function and an operation similar to those described in the first embodiment.

The variable equalizer 213 that corresponds to a suppressing unit according to the invention, suppresses an output signal of the LPF 12 of the microphone 11 at a frequency characteristic set by the gain control unit 23 and outputs it to the superimposing unit 14. A suppressing degree of the variable equalizer 213 is set in accordance with a detection result of the howling detection unit 209. The superimposing unit 14 superimposes a signal (a pseudo noise) output from the HPF 17 to an audio signal output from the variable equalizer 213 and outputs it to an amplifying system.

Meanwhile, the howling preventing apparatus 201 according to the third embodiment can estimate a loop gain by using each of the estimation methods described in the first embodiment.

Figure 9:
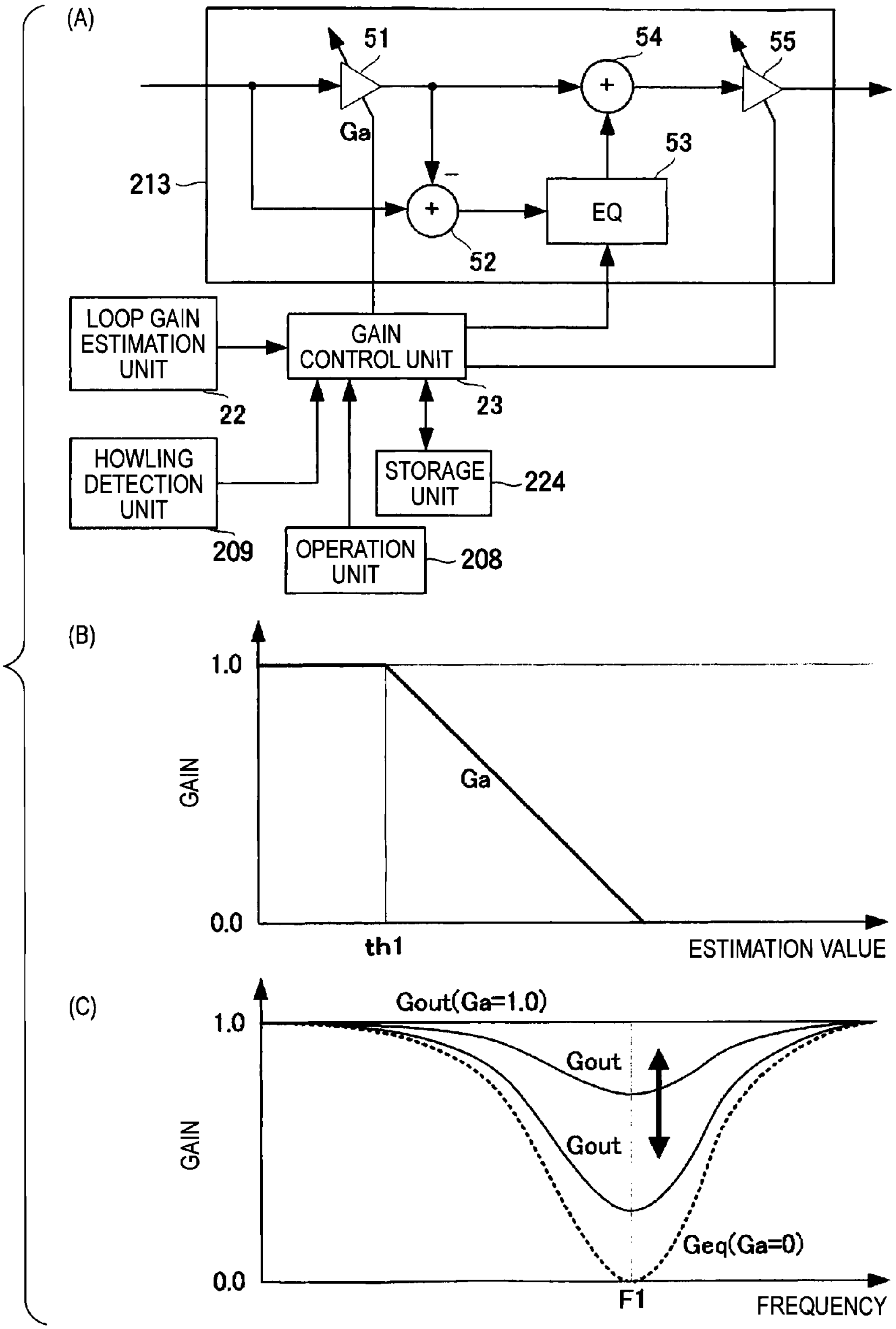
FIG. 9 is an explanatory view showing a variable equalizer.

The loop gain estimated by the loop gain estimation unit 22 is output to the gain control unit 23. The gain control unit 23 sets a suppression degree of the variable equalizer 213 in accordance with the estimated loop gain (hereinafter, referred to as the estimation value) and performs a suppressing process. As an example of setting the suppression degree, an example of setting a frequency characteristic of the variable equalizer 213, is described below. FIG. 9(A) is a block diagram showing a detail structure of the variable equalizer 213.

As shown in FIG. 9(A), the variable equalizer 213 has a gain adjuster 51, an adder 52, an equalizer (EQ) 53, an adder 54 and a gain adjuster 55. The gain adjuster 51 outputs an input signal at a gain Ga set by the gain control unit 23. The adder 52 subtracts an output signal of the gain adjuster 51 from the input signal and outputs it to the EQ 53. The EQ 53 is, for example, a notch filter and an equalizer curve (a central frequency of the notch filter) is determined by a howling occurrence frequency detected by the howling detection unit 209.

The adder 54 adds the output signal of the gain adjuster 51 to the output signal of the EQ 53 and outputs it to the gain adjuster 55. The gain adjuster 55 is set by the gain control unit 23 and adjusts the gain of the whole frequency range. The gain adjuster 55 is fixed in a normal usage condition and is mainly used for adjusting a gain in an initial setting state described later. When a gain of the EQ 53 is represented by Geq, the gain Gout of the output signal of the adder 54 is expressed by the following formula:

$$Gout=Ga+(1-Ga)\times Geq=Geq+(1-Geq)\times Ga.$$

The gain control unit 23 sets the gain Ga so that an effective degree of the EQ 53, i.e., a frequency characteristic of the equalizer is set. Here, the gain control unit 23 sets the gain Ga in accordance with the estimation value input by the loop gain estimation unit 22. The characteristic of the gain Ga is stored in the storage unit 224. The gain control unit 23 reads the characteristic of the gain Ga from the storage unit 224 and sets the gain Ga.

Figure 10:
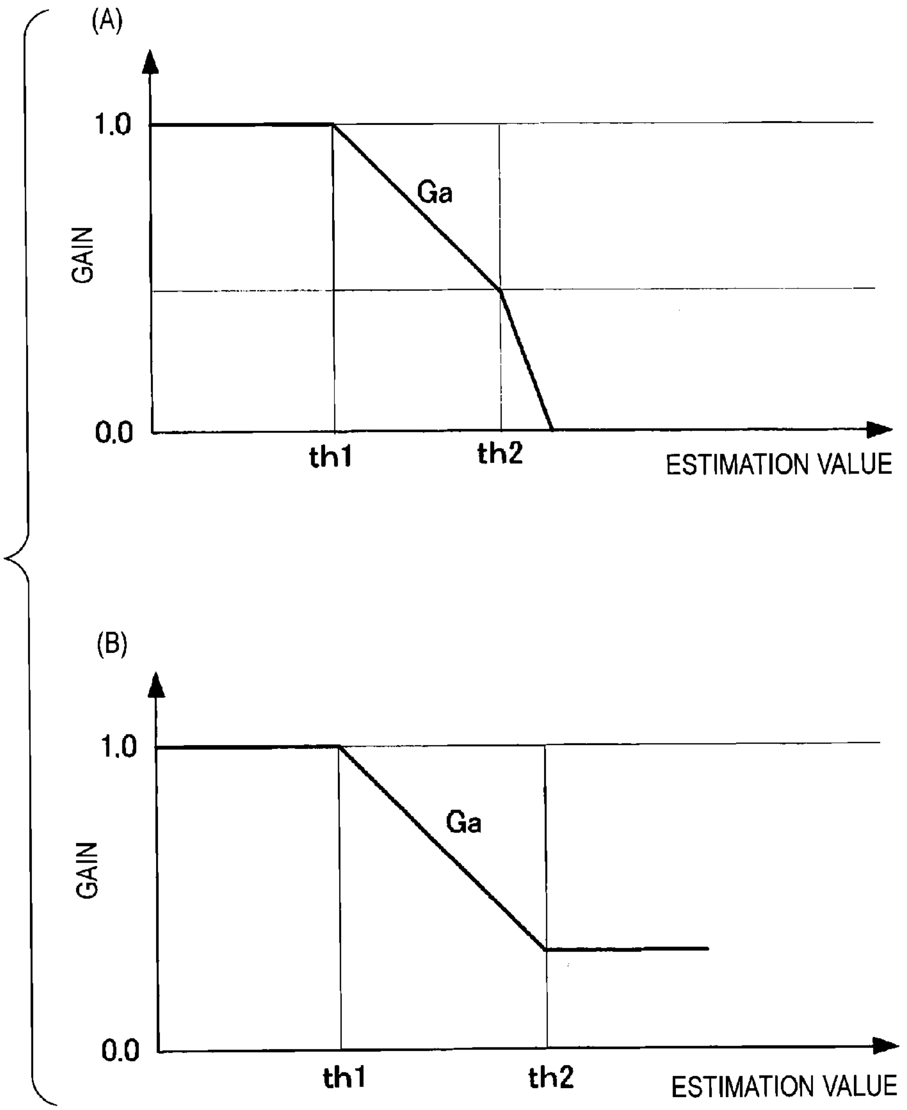
FIG. 10 is an illustrated graph showing changing conditions of a threshold value.

FIG. 9(B) is a graph showing a correlation between an estimation value and a gain Ga. For example, a characteristic that the gain Ga is decreased in proportion to rising of the estimation value in a case where the estimation value becomes higher than a predetermined threshold value th1 as shown in FIG. 9(B), a characteristic that a gain reduction degree of the gain Ga further becomes high in a case where the estimation value exceeds a predetermined threshold value th2 (th2>th1) as shown in FIG. 10(A), and a characteristic that the gain Ga is fixed in a case where the estimation value exceeds the threshold value th2 as shown in FIG. 10(B), are respectively stored in the storage unit 224. Meanwhile, rising of the estimation value and decreasing of the gain Ga are not necessarily in a proportional relationship. For example, it can be a modification in which a decreasing degree of the gain Ga is made narrower as the estimation value rises.

As to the gain characteristics (the threshold values th1 and th2) and inclinations (proportional coefficients), default values stored in the storage unit 224 can be set without change or initial setting can be performed depending on a placement environment.

In a case where the initial setting is performed, a user may designate an item of performing the initial setting of each of the values by operating an operation unit 8. Consequently, the gain control unit 23 gradually increases the gain of the gain adjuster 55 from a minimum value while maintaining the gain Ga at a maximum value (Ga=1.0) so as to increase the loop gain, thereby generating howling. Alternatively, while the gain of the gain adjuster 55 is fixed, the user may bring the microphone 11 into close proximity with the speaker 3, thereby generating howling.

When the howling detection unit 209 detects occurrence of howling, the howling detection unit 209 outputs information indicative of the occurrence of howling (referred to as howling occurrence information) to the gain control unit 23. When the gain control unit 23 inputs the howling occurrence information from the howling detection unit 209, the gain control unit 23 causes the storage unit 224 to store the estimation value at that time. The estimation value is defined as a maximum estimation value to be the threshold value th2. After that, the gain control unit 23 decreases the gain Ga. When the howling detection unit 209 detects that howling is suppressed, the gain control unit 23 correlates the gain value Ga at that time with the maximum estimation value and causes the storage unit 224 to store the gain value Ga as a limit gain. Assuming that a relationship between the estimation value and the gain Ga is a proportional relationship, a suppression start estimation value (the threshold value th1) is an estimation value at a time when the gain Ga is 1 so that the suppression start estimation value can be calculated by an arithmetic operation based on the relationship between the estimation value and the gain Ga. While the proportional coefficient can be an arbitrary value, it can be obtained by measuring a limit gain of one more point at a position having a different distance to the speaker by allowing the user to move the microphone 11. When, for example, the user moves the microphone 11 and designates an item of performing measurement of the second point by operating the operation unit 8, the gain control unit 23 gradually increases the gain Ga so as to generate howling again. The gain control unit 23 defines a value of the gain Ga just before occurrence of howling to be a limit gain of the second point. Alternatively, a value of the gain Ga at a time when the microphone 11 is brought into close proximity to the speaker 3 to generate howling and the gain control unit 23 decreases the gain Ga to suppress the howling, is defined to be a limit gain. A proportional coefficient can be obtained based on the measured limit gains of two points and the estimation values. In an actual case, it is preferable that the threshold value th1 is slightly lower than a value calculated by the arithmetic operation in consideration of a margin having a certain degree. That is, when the threshold value calculated by the arithmetic operation is made to be th1' and a coefficient α (0<α≤1) is used, the threshold value th1 is obtained by the following formula:

$$th1=\alpha\times th1'.$$

Thus, the gain characteristics shown in FIGS. 9(B), 10(A) and 10(B) are obtained by the initial setting.

The above initial setting method is for a case assuming that the estimation value is changed when the distance between the speaker and the microphone is changed and the limit gain is proportionally changed in accordance with the change of the estimation value. That is, the method is for a case assuming that the distance between the speaker and the microphone is extended without changing a relative angle between the speaker and the microphone, an actual loop gain is decreased and the limit gain is increased.

Figure 11:
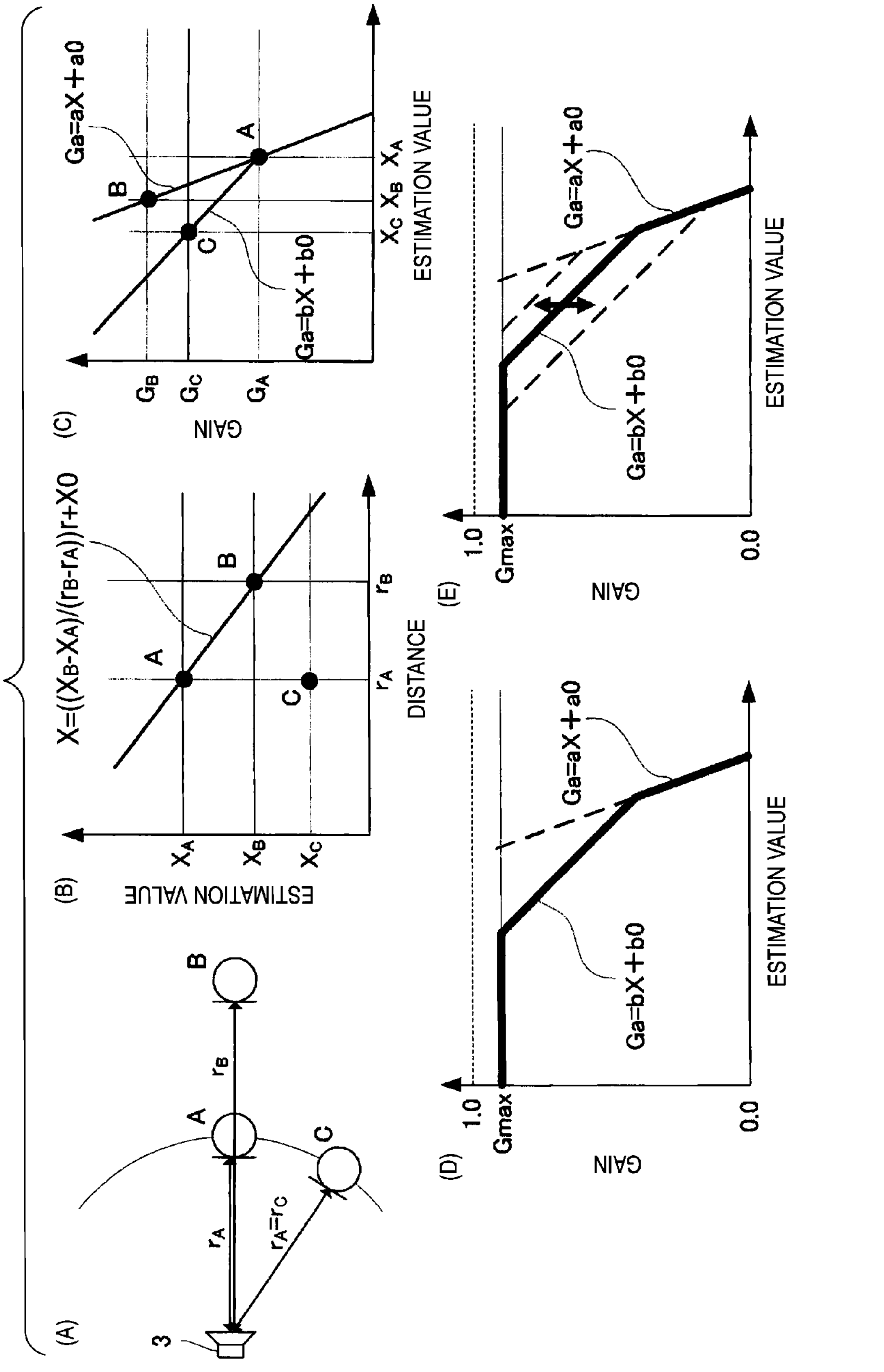
FIG. 11 is an explanatory view showing a method for initial setting.

On the other hand, as shown in FIG. 11(A), in a practical sense, it is thought that even in a case where the distance between the speaker and the microphone is constant, when the relative angle between the speaker and the microphone is changed (when the microphone is moved in a circumferential direction of a circle centering around the speaker), the estimation value is changed and the limit gain is proportionally changed. Namely, it is thought that since a sound output from the speaker has a directivity, the loop gain is decreased and the limit gain is increased even when the microphone is separated from a sound output axis of the speaker. However, the directivity of a sound is sharp in a high frequency range (e.g., equal to or more than 10 kHz) and is dull in a middle frequency range. Therefore, in a case where the microphone is moved in the circumferential direction of a circle centering around the speaker, the loop gain in the low-to-mid frequency range is not decreased so much as that in the high frequency range, and then a difference in change of the loop gain is generated between the high frequency range and the low-to-mid frequency range. Consequently, it is thought that when the estimation value is calculated by using a pseudo noise only in a high frequency range, the change of the limit gain with respect to the change of the estimation value in the circumferential direction is smaller than the change in a distance direction (a direction that only a magnitude of a diameter varies without variation in the circumferential direction in consideration of a circle centering around the speaker, that is, a radial direction). With the above, a method for performing initial setting of the gain characteristic as below, can be provided.

In the initial setting method of the gain characteristic in this example, a measurement process is performed on three points having different positions of a microphone as shown in FIG. 11(A). In the example in FIG. 11(A), in order to ease the explanation, an example in which measurement is performed on two points (point A and point B) on a sound output axis of a speaker and on two points (point A and point C) of which the distances are the same. The point C can be on any position as long as the point C is on a position out of the sound output axis of the speaker.

First, when the user designates the initial setting by using the operation unit 8 so as to designate starting of measurement of a first point (referred to as the point A), the gain control unit 23 gradually increases the gain of the gain adjuster 55 from a minimum value while maintaining the gain Ga at a maximum (Ga=1.0) so as to increase the loop gain, thereby generating howling. Alternatively, while the gain Ga is fixed, the user may bring the microphone 11 into close proximity with the speaker 3, thereby generating howling.

When the gain control unit 23 inputs the howling occurrence information from the howling detection unit 209, the gain control unit 23 decreases the gain Ga. When the howling detection unit 209 detects suppression of the howling, the gain control unit 23 causes the storage unit 224 to store the gain Ga at that time as a limit gain $G_A$. Also, the gain control unit 23 calculates an estimation value $X_A$ and a distance $r_A$ between the speaker 3 and the microphone 11 at that time, and causes the storage unit 224 to store them. The distance between the speaker 3 and the microphone 11 can be calculated based on the delay time period of the closed loop and the sound velocity by using the timer 21. Meanwhile, before calculating the distance, the delay time period is calculated by bringing the speaker 3 into intimate contact with the microphone 11 (the distance is made zero) beforehand, the delay time period at the point where the distance is zero is defined as a delay time period (an inner-device delay time period) excluding a delay time period by an audio, and then a difference between the measured delay time period and the inner-device delay time period can be defined as the delay time period of the closed loop.

In the initial setting of the example, a measurement process similar to the above is performed on the point B and the point C. That is, after performing the measurement on the point A, the user may designate start of measurement on the second point (referred to as the point B) by using the operation unit 8. The gain control unit 23 calculates a limit gain $G_B$ on the point B, an estimation value $X_B$ at that time and a distance $r_B$ between the speaker 3 and the microphone 11, and causes the storage unit 224 to store them. After that, the user may designate start of measurement on a third point (referred to as the point C) by using the operation unit 8. The gain control unit 23 calculates a limit gain $G_C$ on the point C, an estimation value $X_C$ at that time and a distance $r_C$ between the speaker 3 and the microphone 11 (the value of $r_A$ can be used as it is), and causes the storage unit 224 to store them.

Relationships among the limit gains, the estimation values and the distances at the respective positions where the measurement is performed as in the above, are respectively shown in graphs of FIG. 11(B) and FIG. 11(C).

Since the point A and the point B are on the sound output axis of the speaker 3, it is thought that a change of the estimation value due to a change of the distance has similar characteristics in a high frequency range and a low-to-mid frequency range, and a relationship between the estimation value and the limit gain has the most precipitous inclination (the inclination is referred to as "a"). On the other hand, since the distances of the point A and the point C to the speaker 3 are the same and are moved in the circumferential direction of the circle centering around the speaker, it is thought that the loop gain in the low-to-mid frequency range is not changed so much as that of the estimation value in the high frequency range so that a relationship between the estimation value and the limit gain has the gentlest inclination (the inclination is referred to as "b").

Therefore, it is thought that howling does not occur at a value of the gain or less on any point on a straight line (Ga=aX+a0) connecting the point A and the point B and a straight line (Ga=bX+b0) connecting the point A and the point C shown in FIG. 11(C), but howling occurs at a value exceeding the value of the gain on each of the straight lines. Consequently, when a value of a minimum limit gain is set as a gain characteristic in each of estimation values as shown in FIG. 11(D), it is possible to set the gain characteristic corresponding to both of a change in the distance direction and a change in the circumferential direction. An upper limit gain Gmax can be a maximum value (Ga=1) or can be manually set by a user by using the operation unit 8.

However, a value of an intercept b0 of the straight line connecting the point A and the point C is changed in accordance with the estimation value and the distance measured in a normal usage state as shown in FIG. 11(E). That is, the intercept b0 can be represented by a function of the estimation value X and the distance r in accordance with a relationship between the distance and the estimation value: $(X=((X_B-X_A)/(r_B-r_A))r+x0)$ shown in FIG. 11(B) and a relationship: b0=Ga−bX. Therefore, the intercept b0 is changed based on the estimation value X and the distance r measured in a normal usage state. As a result of the above, the gain characteristic is set in such a manner that the shorter the distance is the smaller the intercept b0 and the limit gain are.

Meanwhile, all of the above setting methods are described by the examples each having one speaker. However, in a case where a plurality of speakers are used, the same measurement is performed by each of the speakers. Based on the measurement result, the gain control unit 23 sets a gain characteristic obtained by a speaker having the largest estimation value or sets a gain characteristic obtained by a speaker having the shortest distance.

Figure 12:
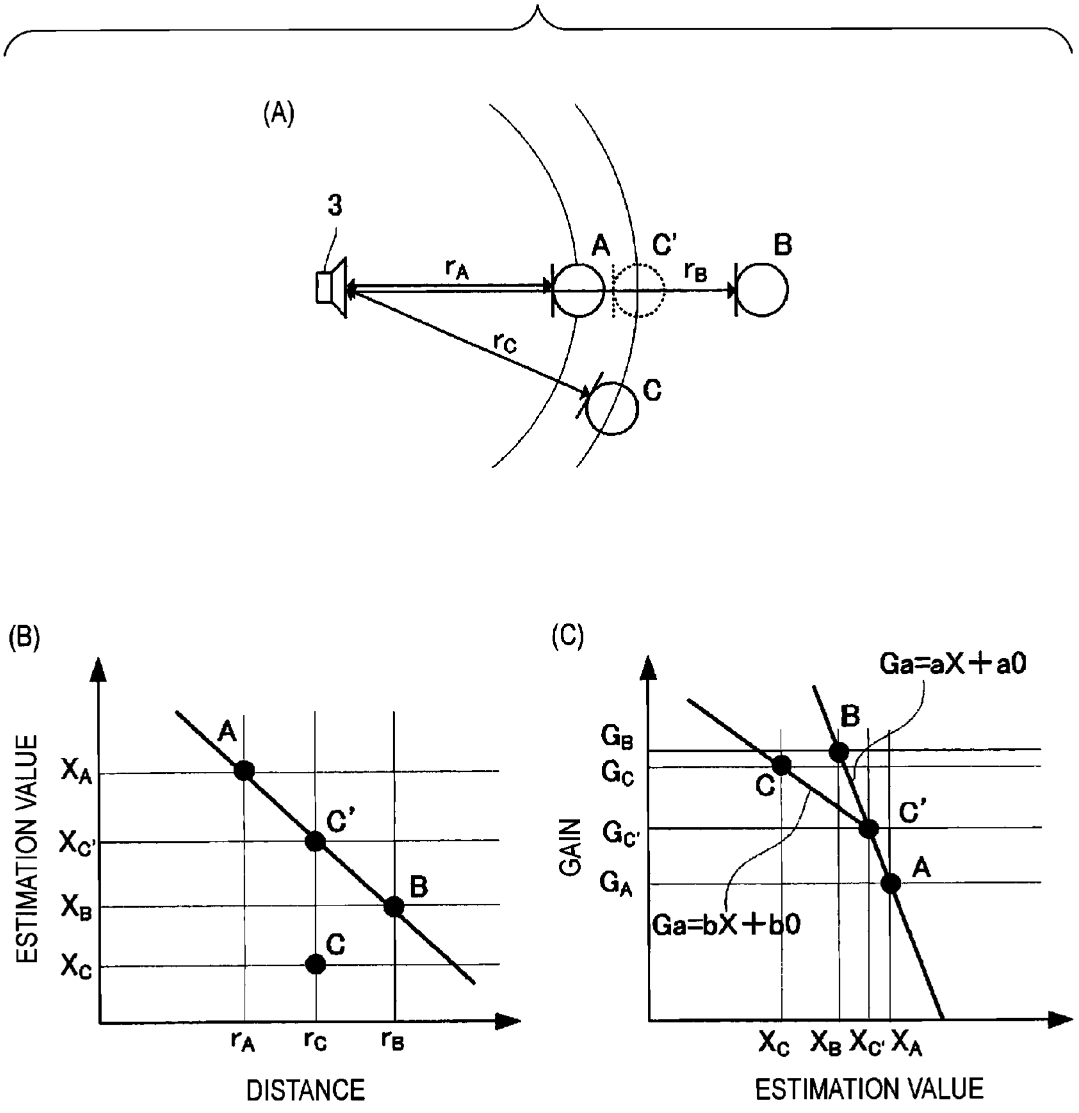
FIG. 12 is an explanatory view showing a method for initial setting.

In a case where a point (a point C) except two points on the sound output axis of the speaker is set on a position having a distance different from the distances of the point A and the point B as shown in FIG. 12(A), a point C' is obtained in such a manner that a value of the distance measured on the point C is plotted on the straight line connecting the point A and the point B in the relationship between the distance and the estimation value as shown in FIG. 12(B), and then an estimation value $X_{C'}$ at that time is obtained. The estimation value $X_{C'}$ is substituted on the straight line connecting the point A and the point B in the relationship between the estimation distance and the gain as shown in FIG. 12(C) so as to obtain a limit gain $G_{C'}$. Consequently, two points (the point C and the point C') which have the same distance and are moved in the circumferential direction can be obtained and the gain characteristic can be set.

The gain control unit 23 changes the gain Ga in accordance with the characteristic of the gain Ga set as in the above and in accordance with the estimation value (and the distance) input by the loop gain estimation unit 22 in a normal usage state.

When the gain Ga is changed, the frequency characteristic of the variable equalizer 213 exhibits a characteristic as shown in FIG. 9(C). When the gain Ga is a maximum (=1.0) as shown in FIG. 9(C), the value Gout is Gout=Ga, and the EQ 53 does not contribute thereto so as to make the gain to be 1 (a flat characteristic) over all the frequencies. When the gain Ga is a minimum (e.g., 0), the value Gout is Gout=Geq, and the frequency characteristic of the EQ 53 is made to be the frequency characteristic of the variable equalizer 213 as it is. When the gain Ga is changed from 0 to 1, the frequency characteristic is changed from that of the EQ 53 to the flat characteristic. That is, the gain control unit 23 changes the gain Ga in accordance with the estimation value so that the equalizer characteristic of the variable equalizer 213 is changed.

Figure 13:
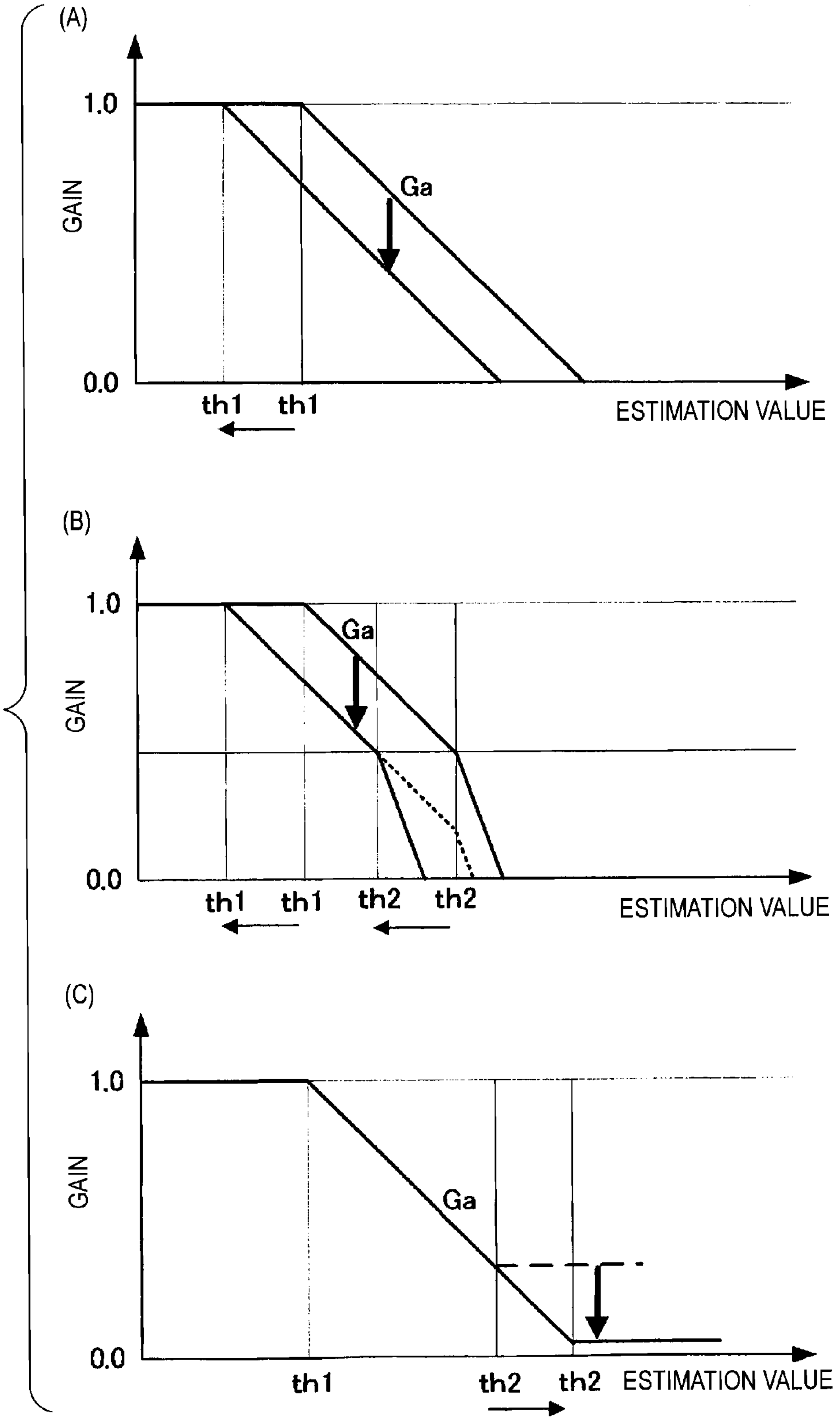
FIG. 13 is a graph showing examples of updating a set gain characteristic.

As shown in FIG. 13(A) or FIG. 13(B), when howling occurs again in the characteristic of the gain Ga once set, the whole characteristic is set to a value which is lower by a predetermined value (e.g., 3 dB). Alternatively, it is possible that the gain Ga is decreased until the howling is suppressed so that the set gain characteristic is updated, or the gain of the gain adjuster 55 is decreased so that the gain is uniformly decreased in the whole frequency range.

Next, a setting method of an equalizer curve (a filter coefficient) of the EQ 53 is described below. The characteristic of the EQ 53 is set in accordance with the detection result of the howling detection unit 209. Here, an example in a case where the EQ 53 functions as a notch filter for decreasing a gain of a predetermined frequency, is described. As described above, when the howling detection unit 209 detects occurrence of howling, the howling detection unit 209 detects a frequency of the occurring howling and outputs howling occurrence information including information about the frequency. The gain control unit 23 inputs the howling occurrence information from the howling detection unit 209 and sets a central frequency F1 of the EQ 53 in accordance with the frequency of the occurring howling. In a case where the howling occurs in a plurality of frequencies, a plurality of central frequencies are set (see FIG. 14(C)). In a case where the plurality of frequencies are to be suppressed, a plurality of stages of the variable equalizers 213 are provided, and the gain Ga and the central frequency of each of the variable equalizers 213 are set. The set central frequencies of the EQs 53 are stored in the storage unit 224. A band width (a Q value) is arbitrary. The gain control unit 23 reads the central frequencies of the EQs 53 determined as in the above from the storage unit 224 and decreases the gains Ga in accordance with the rise of the estimation value so as to control the effective degrees of the equalizers.

While the detection method of the howling detection 209 can be of any type, processes of the method are, for example, performed as below. That is, the howling detection unit 209 converts (FFT) a signal input by the microphone 11 into a signal of a frequency range and holds a plurality of frames of signals after FFT. In a case where a signal of each frequency component having a level equal to or higher than a predetermined level continues for a predetermined time period or more, it is determined that howling occurs at that frequency. The howling detection unit 209 detects a frequency component that has a level equal to or higher than a predetermined level and continues for a predetermined time period or more, in order to discriminate a stationary audio (a sound of a violin or the like) of a musical instrument or voice from howling. In a case where the howling detection unit 209 detects the above frequency component, the howling detection unit 209 checks the presence or absence of an overtone (harmonic) component of the frequency. The howling detection unit 209 determines that howling occurs only when there is not the overtone component.

Figure 14:
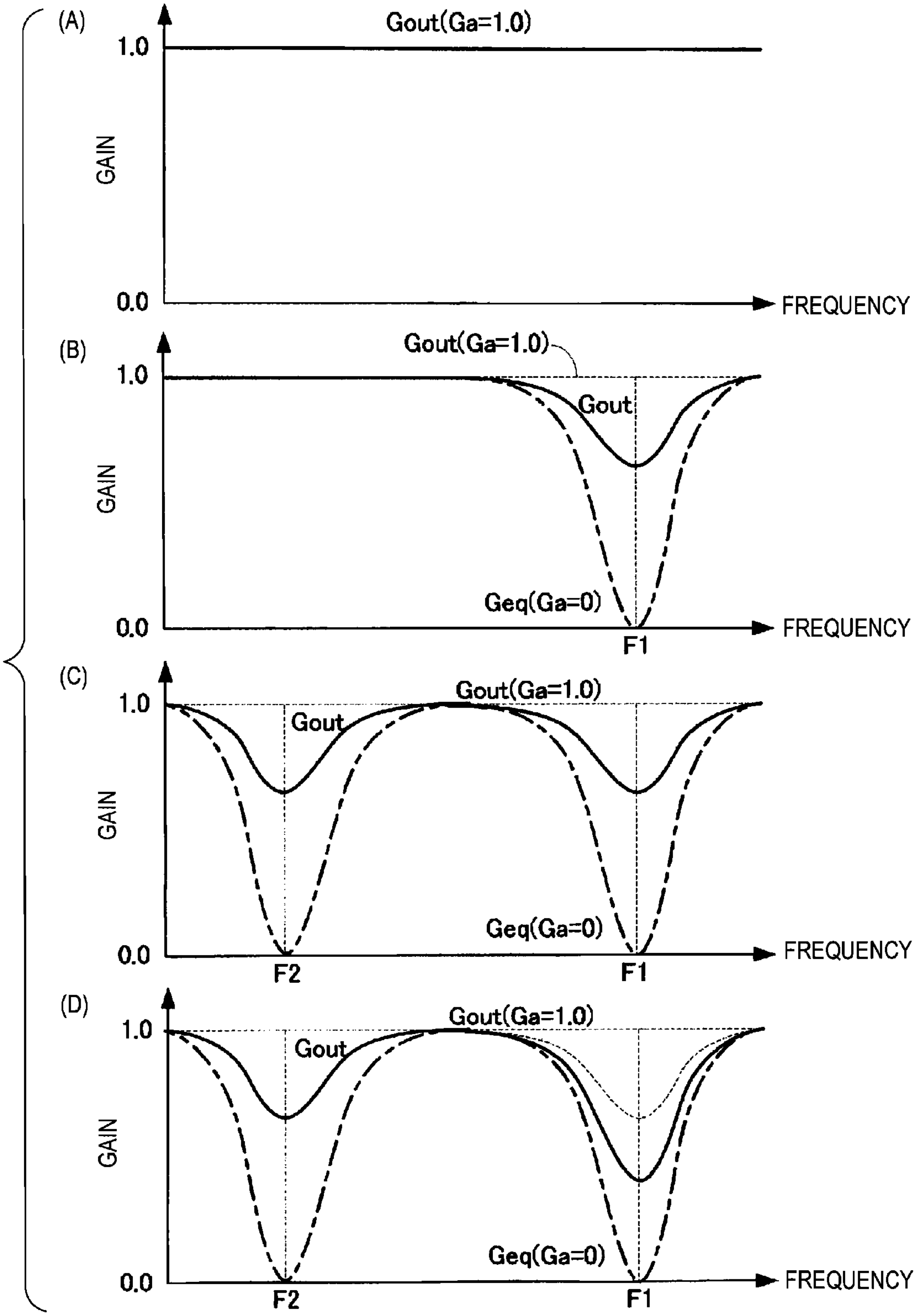
FIG. 14 is a graph showing setting conditions of a threshold value and an equalizer curve.

The above described setting of the threshold value and the equalizer curve (a storing process) and a suppressing process of controlling the gain in accordance with an input of the estimation value are collectively described with reference to FIG. 14.

When howling never occur as shown in FIG. 14(A), the characteristic of the EQ 53 becomes the gain of 1 (a flat characteristic) over all the frequencies. When the howling occurrence information is input, the central frequency F1 of the EQ 53 is set as a howling occurrence frequency as shown in FIG. 14(B). In this case, an equalizer curve indicated by a one-dotted line shown in FIG. 14(B) is set to the EQ 53. The estimation value at that time is set as a maximum estimation value. The gain control unit 23 causes the storage unit 224 to store the maximum estimation value and the central frequency F1.

The gain control unit 23 reads a predetermined gain characteristic (e.g., the characteristic shown in FIG. 10(A) or FIG. 11(D)) stored in the storage unit 224. Alternatively, it is possible that the gain control unit 23 decreases the gain Ga until howling is suppressed and causes the storage unit 224 to store the gain value at a time when the howling is suppressed. As a result, the frequency characteristic indicated by a solid line in FIG. 14(B) is set as an overall frequency characteristic of the variable equalizer 213. After that, the gain control unit 23 changes the gain of the gain adjuster 51 in accordance with the estimation value input by the loop gain estimation unit 22 at each time so as to control the effective degree of the equalizer.

Even when the above suppressing process is performed, there is a possibility of detecting occurrence of howling again. In this case, the gain control unit 23 performs following processes. First, when howling occurrence information indicative of occurrence of howling at a frequency different from a frequency which is detected in the past, is input, a central frequency F2 of another EQ is set to a new howling occurrence frequency as shown in FIG. 14(C). At that time, the central frequency F1 of the EQ 53 already stored in the storage unit 224 and the gain value are fixed. In the above case, a characteristic indicated by a one-dotted line in FIG. 14(C) is set as a whole frequency characteristic of the equalizer. The gain control unit 23 decreases the gain of the variable equalizer having the set central frequency F2 to the gain characteristic similar to the above described, or until the howling is suppressed, and causes the storage unit 224 to store the gain value at a time when the howling is suppressed.

Meanwhile, the estimation value at a time howling newly occurs, can be different from or the same as the above described maximum estimation value. Also, the suppression start estimation value (the threshold value th1) can be common to each of the stages of the variable equalizers 213 or can be different among the stages of the variable equalizers 213. In a case where the suppression start estimation value is different among them, each of the maximum estimation values and each of the suppression start estimation values is stored in the storage unit 224.

After that, the gain control unit 23 controls the effective degree of the equalizer in a plurality of ranges in accordance with the estimation value input by the loop gain estimation unit 22.

In a case where howling occurs at a frequency the same as the frequency already set (e.g., the frequency F1) as shown in FIG. 14(D), the gain at the frequency F1 is further decreased. That is, the gain Ga is set to a value lower by a predetermined value (e.g., 3 dB) as shown in FIG. 13(A) or FIG. 13(B). Alternatively, the gain Ga is changed to be a much lower value until the howling is suppressed.

As shown in FIG. 13(A) or FIG. 13(B), when the gain Ga is changed to the lower value, the threshold value th1 as the suppression start estimation value is changed to be a much lower value. In FIG. 13(B), the whole gain Ga can be decreased (a characteristic shown by the dotted line) by leaving the threshold value th2 as it is or the threshold value th2 can be decreased so as to maintain the gain Ga at the time of the threshold value th2 before changing.

Meanwhile, in a case where howling occurs at the estimation value higher than the threshold value th2, setting of suppressing the gain in the overall frequency range is performed by the adjuster 55. Alternatively, in a case where the estimation value exceeds the threshold value th2 as shown in FIG. 13(C), when a characteristic of fixing the gain Ga is set, setting of changing the threshold value th2 to be a large value, is performed.

Figure 15:
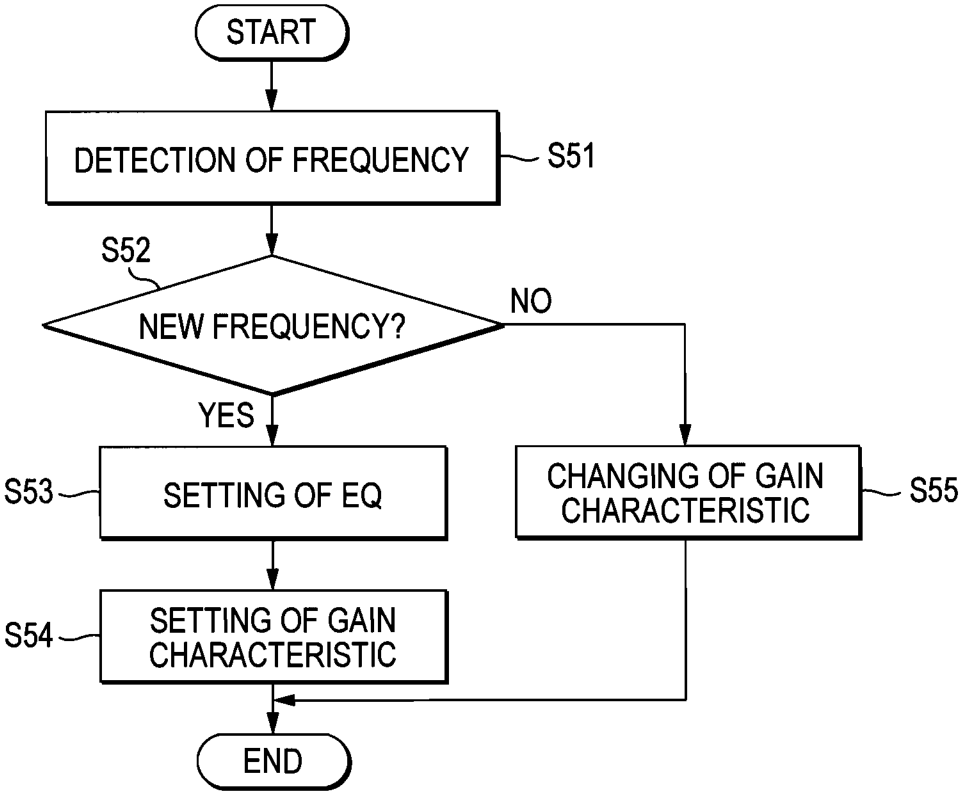
FIG. 15 is a flow chart showing a gain characteristic varying operation in a normal usage state.

Next, FIG. 15 is a flowchart showing a gain characteristic change operation in a normal usage state. When the gain control unit 23 inputs howling occurrence information from the howling detection unit, the gain control unit 23 starts the operation. First, the gain control unit detects a frequency included in the howling occurrence information (s51).

In a case where the gain control unit 23 detects occurrence of howling at a frequency different from the frequency detected in the past, or detects occurrence of howling at first (s52→Yes), the gain control unit 23 sets the central frequency of the EQ 53 (s53). The gain control unit 23 sets the characteristic of the gain Ga (s54). For example, it sets the gain characteristic as shown in FIG. 10(A) or FIG. 11(D). The set characteristic of the gain Ga is stored in the storage 224. The gain characteristic at that time can be determined by a storing process shown in FIG. 16 described later.

On the other hand, when the frequency is the same as the frequency detected in the past in the process of s52, the processes of s53 and s54 are skipped and changing of the gain characteristic is performed (s55). For example, the characteristic is changed to one for decreasing the gain Ga as a whole by 3 dB (see FIG. 13(A) or FIG. 13(B). After that, the gain control unit 23 reads the characteristic of the gain Ga stored in the storage unit 224 in the storing process, and adjusts the gain of the gain adjuster 51 of the variable equalizer 213 in accordance with the estimation value input by the loop gain estimation unit 22.

Figure 16:
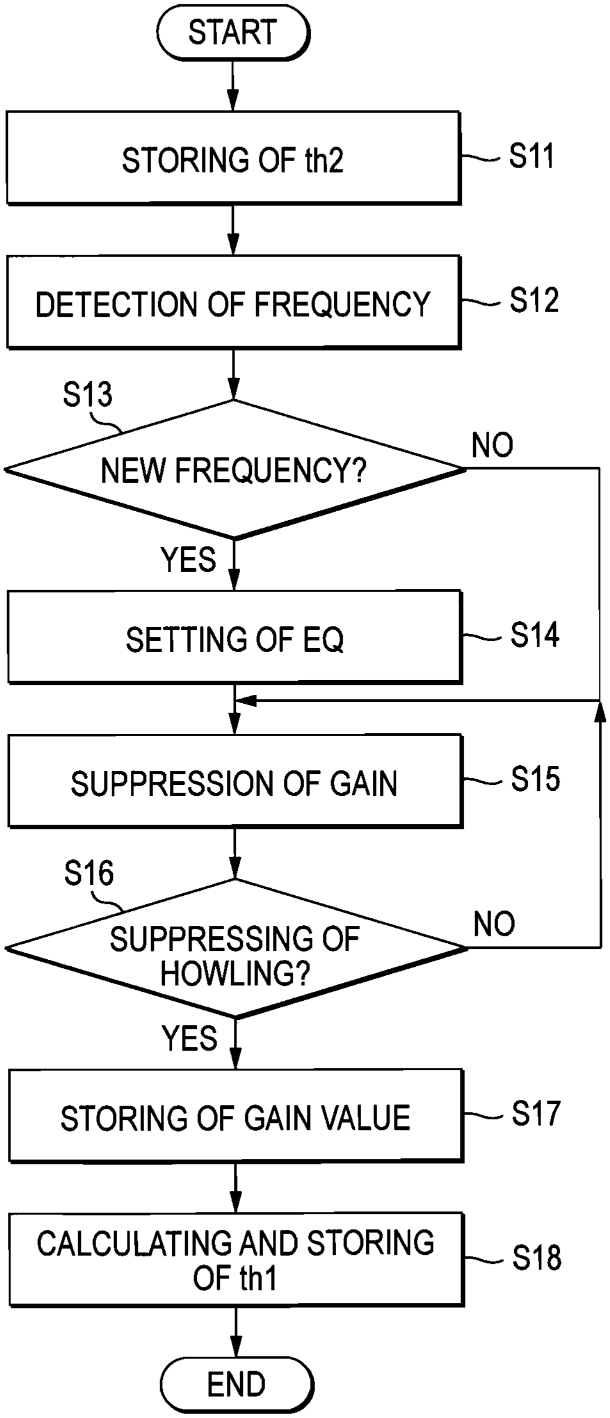
FIG. 16 is a flow chart showing an operation of a storing process.

Next, FIG. 16 is a flowchart showing an operation of a storing process according to another embodiment of the setting method of the characteristic of the gain Ga. When the gain control unit 23 inputs howling occurrence information from the howling detection unit, the gain control unit 23 starts the operation. First, the gain control unit 23 performs storing of the estimation value input at the present as a maximum estimation value (s11). Meanwhile, in a case where the maximum estimation value is already stored in the storage unit 224, the process is ignored. However, in a case where the estimation value input at the present is larger than the maximum estimation value already stored, it is updated to the estimation value input at present. After that, the gain control unit 23 detects a frequency included in the howling occurrence information (s12).

In a case where the gain control unit 23 detects occurrence of howling at a frequency different from the frequency detected in the past, or occurrence of howling is detected at first (s13→Yes), the central frequency of the EQ 53 is set (s14). When the frequency is the same as the frequency detected in the past, the process of s14 is skipped.

The gain control unit 23 decreases the gain of the gain adjuster 51 of the variable equalizer 213 (s15). While a decrease amount of the gain at one step can be any value, it is made to be, for example, −3 dB. After that, the gain control unit 23 determines whether or not the howling is suppressed (the howling occurrence information is not input by the howling detection unit 209) (s16). When the howling is not suppressed, the gain of the gain adjuster 51 is decreased again (s16→s15). When the howling is suppressed, the gain control unit 23 causes the storage unit 224 to store the gain value at that time (s17). The gain control unit 23 calculates a suppression start estimation value based on the maximum estimation value stored in s11 and the gain value stored in s17 and causes the storage unit 224 to store the value (s18). In a case where the gain value or the threshold value th1 are already stored in the storage unit 224, the values are updated.

After that, the gain control unit 23 reads, from the storage unit 224, the threshold value th1, the maximum estimation value and the gain value which are stored in the storage unit 224 in the storing process, and adjust the gain of the gain adjuster 51 of the variable equalizer 213 in accordance with the estimation value input by the loop gain estimation unit 22. That is, the gain control unit performs a suppressing process for controlling an effective degree of the equalizer in accordance with the estimation value at that time. In a case where the howling occurrence information is input in the suppressing process, the operation of the storing process is performed again.

Thus, the howling preventing apparatus estimates the gain of the closed loop and suppresses the audio signal by the frequency or the gain (the equalizer characteristic) to be suppressed based on the estimated loop gain, thereby the howling preventing apparatus can suppress occurrence of howling beforehand. In addition, the howling preventing apparatus 201 automatically sets the equalizer characteristic based on the estimated loop gain so that the occurrence of howling can be surely suppressed in response to a change of the environment in the audio space without the need of skill.

While the above embodiment shows an example in which the variable equalizer 213 has the equalizer and the characteristic of the equalizer is set in accordance with the loop gain estimated by the gain control unit 23, it is possible to give an embodiment having a structure that only adjusts the gain and controls the gain in the whole frequency range as a suppression degree.

The third embodiment can be combined with the above described second embodiment.

Fourth Embodiment

Figure 17:
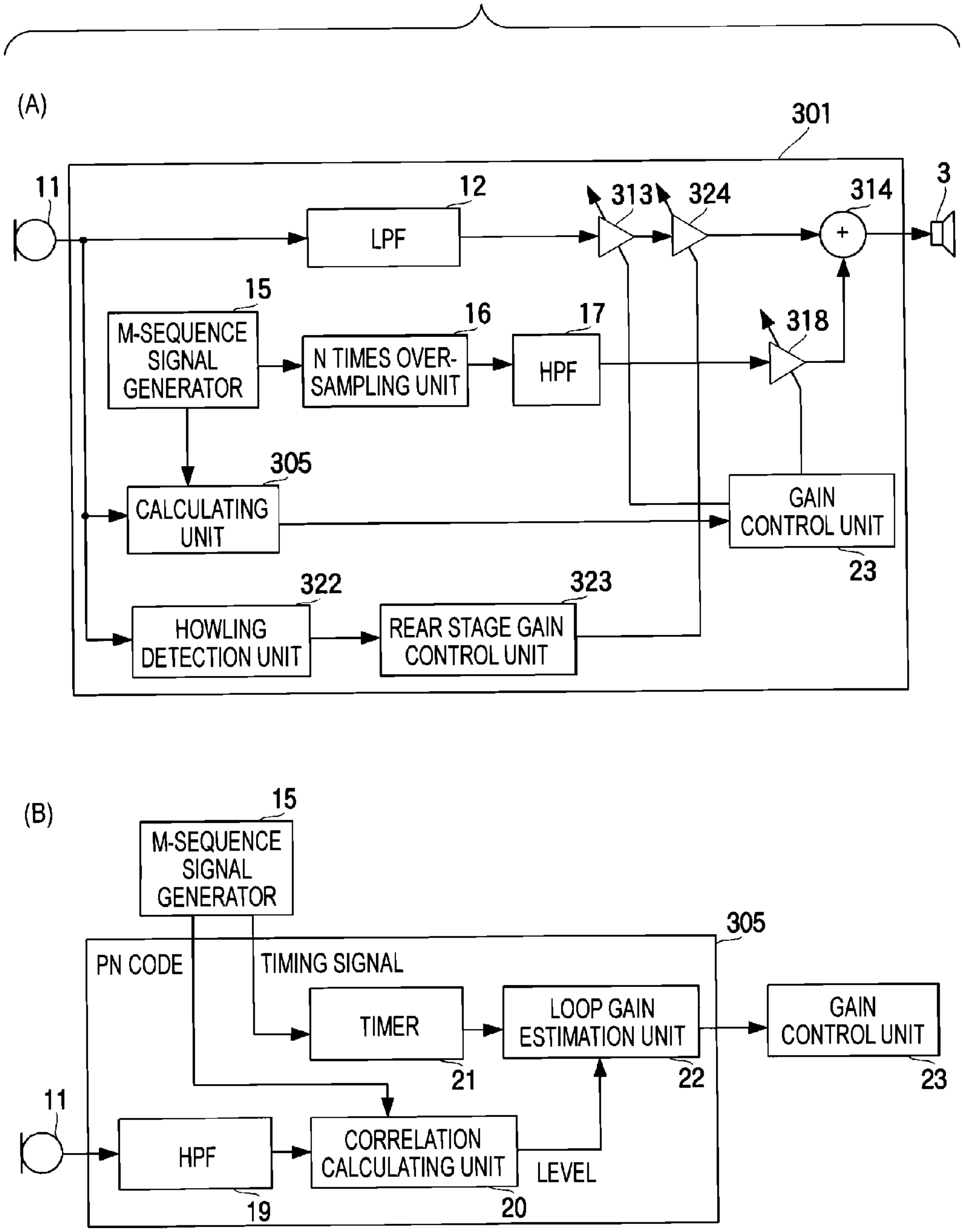
FIG. 17 is a block diagram showing a howling preventing apparatus according to a fourth embodiment.

FIG. 17 is a block diagram showing a structure of a howling preventing apparatus according to a fourth embodiment of the invention. In the descriptions of the embodiment, all of the audio signals are defined as digital signals unless a specific description is added, and a structure of performing A/D conversion or D/A conversion is omitted. Parts having structures the same as in the calculating unit 5 and the pseudo noise superimposing unit 7 in the howling preventing apparatus 1 shown in FIG. 1 are denoted by the same numerals, and their descriptions are omitted.

The howling preventing apparatus 301 performs processes of superposing a pseudo noise to an audio signal picked up by the microphone 11 (the audio pickup unit) and outputting the superimposed signal to the speaker 3 passing through an amplifying system (not shown) at a following stage. A sound output from the speaker 3 is fed back to the microphone 11, thereby forming a closed loop. The howling preventing apparatus 301 obtains a correlation between the superimposed pseudo noise and the feedback audio signal so as to estimate a gain of the closed loop. The howling preventing apparatus can prevents howling beforehand by suppressing the gain of the audio signal or generating a warning in a case where the estimated loop gain approaches a predetermined threshold value. Further, the howling preventing apparatus 301 has a howling detection unit and further suppresses the gain of the audio signal in a case where occurrence of howling is detected so as to suppress the howling.

As shown in FIG. 17(A), the howling preventing apparatus 301 includes the LPF 12, a preceding stage volume 313, a following stage volume 324, a superimposing unit 314, the M-sequence signal generator 15, the N times over-sampling unit 16, the HPF 17, a volume for pseudo noise 318, an calculating unit 305, the gain control unit 23, the howling detection unit 22 and a following stage gain control unit 323.

As shown in FIG. 17(B), the calculating unit 305 is configured by the HPF 19, the correlation calculating unit 20, the timer 21 and the loop gain estimation unit 22.

An audio signal picked up by the microphone 11 is input to the LPF 12 and the HPF 19 of the calculating unit 305.

The audio signal picked up by the microphone 11 is input to the LPF 12. The LPF 12 cuts off a high frequency range from the picked up audio signal and outputs it to the preceding stage volume 313.

The preceding stage volume 313 outputs the input signal to the following stage volume 324 at a gain set by the gain control unit 323. The following stage volume 324 outputs the input signal to the superimposing unit 314 at a gain set by the following stage gain control unit 323.

Each of the M-sequence signal generator 15, the N times over-sampling unit 16, the HPF 17, and the superimposing unit 314 has a structure, a function and an operation similar to those described in the first embodiment. Also, the correlation calculating unit 20 has a structure, a function and an operation similar to those described in the first embodiment. As an estimating method of a loop gain in the loop gain estimation unit 22, each of the estimation methods in the first embodiment can be used.

The loop gain estimated by the loop gain estimation unit 22 is output to the gain control unit 23. In a case where the estimated loop gain approaches a predetermined threshold value th, the gain control unit 23 determines that there is a high possibility that howling occurs and instructs to suppress the gain of the preceding stage volume 313. The gain control unit 23 can perform generating a warning (lighting of an LED, displaying of a warning on a display, or the like) in the case where the loop gain approaches the threshold value. In a case where the generating a warning is performed, a user may manually adjust the gain or the equalizer.

Meanwhile, it is possible to perform one of the process of suppressing the gain and the process of generating a warning, or to perform the generating a warning and further suppressing the gain of the audio signal. It is possible to take a modification that the generating a warning is first performed and, after that, the process of suppressing the gain is performed.

Here, the predetermined threshold value th differs depending on the estimation method of the loop gain. The predetermined threshold value th can be made any value, but a margin having a certain degree is set to the threshold value. For example, a user may carry out an operation of increasing or decreasing a gain before actual use. At that time, when a howling detection unit 322 detects occurrence of howling, the gain control unit 323 makes the input estimation value of the loop gain to be a maximum value thmax of the threshold value and obtains the value of th=α×thmax by using a coefficient α (0<α≤1).

The gain control unit 323 instructs to suppress the gain of the volume for pseudo noise 318. However, the gain equal to or larger than a predetermined value is maintained so that the first peak of the correlation of the pseudo noise can be detected.

Thus, the calculating unit 305 estimates the gain of the closed loop, and performs a process of suppressing the gain of the audio signal or a process of generating a warning in a case where the estimated loop gain approaches a predetermined threshold value, and thereby the calculating unit 305 can suppress occurrence of howling beforehand.

Next, the controlling of a gain of the howling detection unit 322 and the following stage volume 324 is described below. While the howling detection method of the howling detection unit 322 can be of any type, processes of the method are, for example, performed as below.

The howling detection unit 322 analyzes a frequency of an audio signal so as to detect presence or absence of occurrence of howling. That is, the howling detection unit 322 converts (FFT) a signal input by the microphone 11 into a signal of a frequency range and holds a plurality of frames of signals after the FFT. In a case where a signal of each frequency component having a level equal to or higher than a predetermined level continues for a predetermined time period or more, it is determined that howling occurs at that frequency. The howling detection unit 322 detects a frequency component that has a level equal to or higher than a predetermined level and continues for a predetermined time period or more, in order to discriminate a stationary audio (a sound of a violin or the like) of a musical instrument or voice from howling. In a case where the howling detection unit 322 detects the above frequency component, the howling detection unit 209 checks the presence or absence of an overtone component of the frequency. The howling detection unit 209 determines that howling occurs only when there is not the overtone component.

Information about occurrence of howling and information indicative of its frequency (referred to as howling occurrence information) is input to the following stage gain control unit 323. When the following stage gain control unit 323 inputs the howling occurrence information from the howling detection unit 322, the following stage gain control unit 323 sets that the gain of the following stage volume 324 is suppressed. In a case where the howling detection unit 322 does not detect occurrence of howling, the gain is restored to its original value (made to be 0 dB). The following stage gain control unit 323 stepwise suppresses the gain (e.g., −3 dB per 1 second) when the howling occurrence information is input, and then the following stage gain control unit 323 suppresses the gain until the occurrence of howling is not detected. In a case where the gain is restored, the gain can be restored by a change amount the same as that in the suppressing time (e.g., 3 dB per 1 second) or restored in a curve gentler than that in the suppressing time (e.g., 1 dB per 1 second). In a case where howling occurrence information is input again during the restoring of the gain, the gain is suppressed until the occurrence of howling is not detected again.

In the howling preventing apparatus of the embodiment, the loop gain can be estimated by the calculating unit 305 so that occurrence of howling can be prevented beforehand. However, in a case where a disturbance noise becomes large, there is a possibility that the calculating unit 305 is not able to calculate a peak of a correlation. In addition, since this is a modification of calculating a correlation of an audio signal, a Doppler shift may occur and a frequency of a pseudo noise may vary in a case where the microphone is moved, so that there is a possibility that a peak of a correlation can not be calculated. Consequently, in this modification, in a case where the howling detection unit 322 detects howling, the gain is suppressed by the following stage volume 324 so that howling is immediately suppressed even if the howling occurs.

The embodiment shows an example of suppressing a gain of an audio signal by the following stage volume 324. However, it is possible to suppress howling by a notch filter or the like that suppresses a frequency detected by the howling detection unit 322. In this case, the following stage volume 324 is replaced with the notch filter and the following stage gain control unit 23 sets a frequency and a gain of the notch filter.

In accordance with the embodiment, occurrence of howling is suppressed beforehand by estimating a loop gain, and the howling can be suppressed even if howling occurs.

Modification

Each of the howling preventing apparatuses 1, 101, 201, and 301 of first to fourth embodiments can be built in a mixer for producing a music, a microphone for picking up an audio or an adapter. In a case where the howling preventing apparatus is built in the adapter, it is possible to form a structure in which a microphone is connected to an input unit (an input interface) of the adapter and audio signal that is picked up by the microphone and input via the input unit, is supplied to the calculating unit and the pseudo noise superimposing unit. At any rate, it is enough that each of the howling preventing apparatuses 1, 101, 201, and 301 is provided at a preceding stage of an amplifying system such as an amplifier device or the like.

Figure 18:
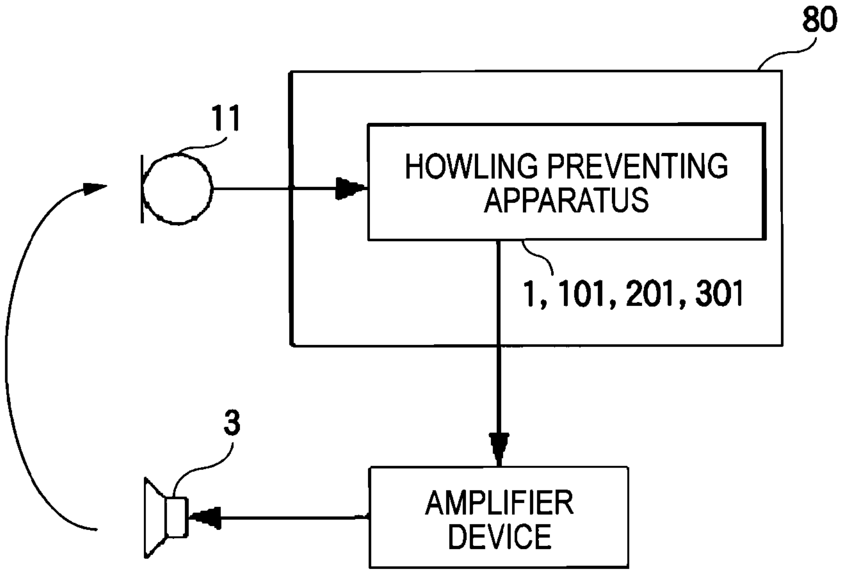
FIG. 18 is a block diagram showing a structure of a mixer built in the howling preventing apparatus according to the first to fourth embodiments.

FIG. 18 is a block diagram showing a structure of a mixer 80 having, built therein, any one of the howling preventing apparatuses 1, 101, 201 and 301 according to the first to fourth embodiments. An audio signal picked up by the microphone 11 is input to the mixer 80. An audio signal output from the mixer 80 is processed by the howling preventing apparatus 1, 101, 201 or 301 and is output to an amplifying system (an amplifier device) at the following stage to be amplified, thereby the signal is output from the speaker 3 as a sound. While the mixer 80 actually has a plurality of input channels and a plurality of output channels, only a system of one channel is shown in order to ease the explanation of the modification.

Figure 19:
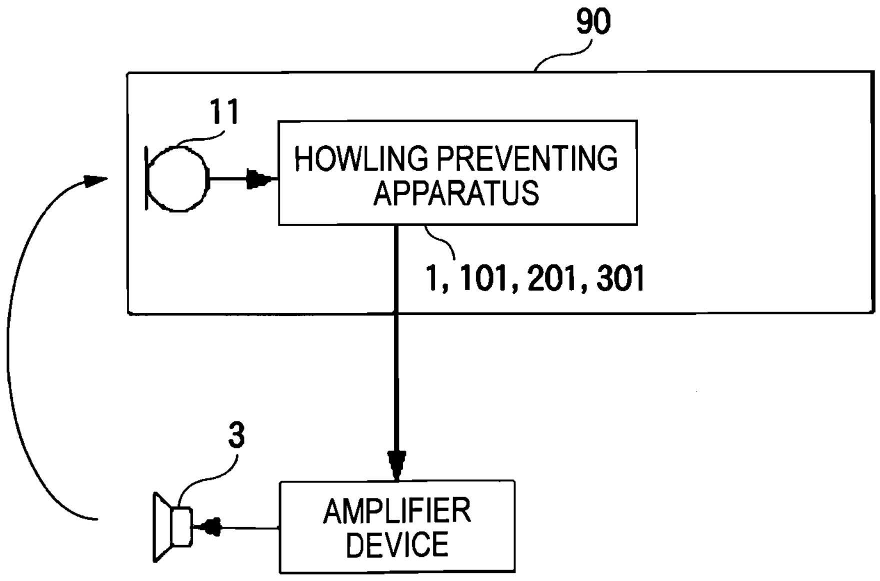
FIG. 19 is a block diagram showing a microphone (a microphone unit) built in the howling preventing apparatus according to the first to fourth embodiments.

FIG. 19 is a block diagram showing a structure of a microphone (a microphone unit) 90 having, built therein, any one of the howling preventing apparatuses 1, 101, 201 and 301 according to the first to fourth embodiments. The microphone unit 90 is, for example, driven by a battery. The microphone unit 90 has the microphone 11 (a microphone device) and the howling preventing apparatus 1, 101, 201 or 301. An audio picked up by the microphone 11 is processed by the howling preventing apparatus 1, 101, 201 or 301. An audio signal picked up by the microphone 11 is processed by the howling preventing apparatus 1, 101, 201 or 301 and is output to an amplifying system (an amplifier device) at the following stage to be amplified, thereby the signal is output from the speaker 3 as a sound.

In accordance with the invention, a loop gain estimating apparatus for estimating a gain of a closed loop can be formed. With this case, the loop gain estimating apparatus does not control a gain of an audio signal and outputs information about the estimated gain of the closed loop to, for example, an external device such as a mixer or an amplifying system so that the loop gain estimating apparatus causes the external device to control the gain of the audio signal based on the estimated gain of the closed loop.

The invention claimed is:

1. A howling preventing apparatus comprising:
- an input unit that inputs an audio signal;
- a noise generation unit that generates and outputs a pseudo noise;
- a superimposing unit that superimposes a component of a frequency of the pseudo noise output from the noise generation unit to the audio signal input by the input unit and outputs the superimposed signal to an amplifying system, the frequency being higher than a predetermined frequency;
- a correlation calculating unit that calculates a correlation value between the audio signal input by the input unit and the pseudo noise generated by the noise generation unit;
- a loop gain estimation unit that estimates a gain of a closed loop based on the correlation value calculated by the correlation calculating unit;
- a gain control unit that controls to suppress the gain of the audio signal based on the gain of the closed loop estimated by the loop gain estimation unit; and
- a frequency control unit that controls to change a number of times of calculating a correlation value by the correlation calculating unit in accordance with the gain of the closed loop estimated by the loop gain estimation unit.

2. The howling preventing apparatus according to claim 1, wherein the gain control unit suppresses the gain of the audio signal in a case where the gain of the closed loop estimated by the loop gain estimation unit exceeds a predetermined threshold value.

3. The howling preventing apparatus according to claim 1, wherein the loop gain estimation unit estimates the gain of the closed loop based on a value of one peak of a waveform indicating a temporal transition of the correlation value calculated by the correlation calculating unit or a sum of values of a plurality of peaks of the waveform.

4. The howling preventing apparatus according to claim 1, wherein the gain control unit controls to maintain a level of the pseudo noise to be equal to or higher than a predetermined value in a case where the gain control unit controls to suppress the gain of the audio signal.

5. The howling preventing apparatus according to claim 1, further comprising:
- a delay time period calculating unit that calculates a delay time period from when the noise generation unit outputs the pseudo noise until the correlation calculating unit calculates a correlation value equal to or higher than a predetermined value,
- wherein the frequency control unit controls to change the frequency of calculating a correlation value by the correlation calculating unit in accordance with the delay time period calculated by the delay time period calculating unit.

6. The howling preventing apparatus according to claim 5, wherein the frequency control unit controls to change the frequency of calculating a correlation value by the correlation calculating unit, unless each of the gain of the closed loop estimated by the loop gain estimation unit and the delay time period calculated by the delay time calculating unit is changed for a predetermined time period.

7. The howling preventing apparatus according to claim 1, wherein the frequency control unit controls to change at least one of a length, a generation interval and a number of sequences of the pseudo noise generated by the pseudo noise generation unit in accordance with the gain of the closed loop estimated by the loop gain estimation unit.

8. The howling preventing apparatus according to claim 1 further comprising:

a suppressing unit that suppresses the audio signal input by the input unit at a suppression degree in response to an estimation value as a value of the gain estimated by the loop gain estimation unit; and a howling detection unit that detects occurrence of howling in the audio signal input by the input unit, wherein the gain control unit sets the suppression degree in response to the estimation value when the howling detection unit detects the occurrence of howling.

9. The howling preventing apparatus according to claim 8, further comprising:

an operation unit that receives an initial setting instruction for performing initial setting of a characteristic of the suppression degree with respect to the estimation value, wherein the gain control unit changes the suppression degree set to the suppressing unit in each of a plurality of points when the operation unit receives the initial setting instruction, measures a limit suppression degree capable of suppressing howling, measures the estimation value at that time and a distance between a speaker and a microphone, and performs an initial setting process for calculating and setting the characteristic of the suppression degree based on the limit suppression degree, the estimation value and the distance between the speaker and the microphone which are measured at each of the plurality of points.

10. The howling preventing apparatus according to claim 8, wherein the howling detection unit detects a frequency of howling occurring in the audio signal;

wherein the suppressing unit has an equalizer which suppresses the audio signal;

wherein the suppression degree is information indicative of a frequency characteristic of the equalizer; and wherein the gain control unit sets the suppressing unit so as to suppress the frequency detected by the howling detection unit and controls the frequency characteristic of the equalizer.

11. The howling preventing apparatus according to claim 10, wherein when occurrence of howling is detected at a frequency different from a frequency of howling that occurred in the past, the gain control unit sets the suppressing unit so as to further suppress the frequency.

12. The howling preventing apparatus according to claim 8, further comprising:

a storage unit, wherein the gain control unit inputs the estimation value from the loop gain estimation unit;

wherein the storage unit stores the input estimation value when the howling detection unit detects occurrence of the howling, wherein when the howling detection unit detects suppression of the howling, the storage unit stores the suppression degree set to the suppressing unit at a time when the howling is suppressed; and wherein the gain control unit reads the estimation value and the suppression degree from the storage unit, and controls a suppression degree of the audio signal in the suppressing unit in accordance with the estimation value input by the loop gain estimation unit.

13. The howling preventing apparatus according to claim 1, further comprising:

a howling detection unit that detects occurrence of howling in an audio signal input to the input unit;

a first suppressing unit that suppresses an audio signal input by the input unit based on the gain of the closed loop estimated by the loop gain estimation unit; and a second suppressing unit that suppresses an audio signal input by the input unit when the howling detection unit detects the occurrence of howling.

14. The howling preventing apparatus according to claim 13, wherein the second suppressing unit suppresses a gain so as to suppress the audio signal and restores the gain to its original level in a case where the howling detection unit detects no occurrence of howling.

15. The howling preventing apparatus according to claim 1, further comprising:

a warning unit that performs a warning in a case where the gain of the closed loop approaches a predetermined threshold value.

16. The howling preventing apparatus according to claim 1, further comprising:

a sound output unit that is connected to the howling preventing apparatus and outputs a sound based on the audio signal which is output from the superimposing unit to the amplifying system and is superimposed with the pseudo noise.

17. The howling preventing apparatus according to claim 1, further comprising:

a microphone that is connected to the howling preventing apparatus and has an audio pickup unit for picking up an audio and supplying the audio signal, wherein the audio signal supplied from the microphone is input to the input unit.

18. A loop gain estimating apparatus comprising:

an input unit that inputs an audio signal;

a noise generation unit that generates and outputs a pseudo noise;

a superimposing unit that superimposes a component of a frequency of the pseudo noise output from the noise generation unit to the audio signal input by the input unit and outputs the superimposed signal to an amplifying system, the frequency being higher than a predetermined frequency;

a correlation calculating unit that calculates a correlation value between the audio signal input by the input unit and the pseudo noise generated by the noise generation unit;

a loop gain estimation unit the estimates a gain of a closed loop based on the correlation value calculated by the correlation calculating unit; and a frequency control unit that controls to change a number of times of calculating a correlation value by the correlation calculating unit in accordance with the gain of the closed loop estimated by the loop gain estimation unit.

19. The loop gain estimating apparatus according to claim 18, wherein the loop gain estimation unit estimates a gain of the closed loop based on a value of one peak of a waveform indicating a temporal transition of the correlation value calculated by the correlation calculating unit or a sum of values of a plurality of peaks of the waveform.

20. The loop gain estimating apparatus according to claim 18, further comprising:

a warning unit that performs a warning in a case where the gain of the closed loop approaches a predetermined threshold value.

21. A microphone comprising:

an audio pickup unit that has, built therein, a howling preventing apparatus according to claim 1, and picks up an audio and supplies an audio signal to the input unit.

22. A mixer comprising:

a howling preventing apparatus according to claim 1, the howling preventing apparatus being built in the mixer.

23. An adapter comprising:

a howling preventing apparatus according to claim 1, the howling preventing apparatus being built in the adapter.

* * * * *